United States Patent
Williams

(10) Patent No.: US 10,243,261 B2
(45) Date of Patent: Mar. 26, 2019

(54) DATA COMMUNICATIONS CASE HAVING AN INTERNAL ANTENNA ARRAY

(71) Applicant: Plum Laboratories, LLC, Springfield, TN (US)

(72) Inventor: Dawson Lee Williams, Springfield, TN (US)

(73) Assignee: Plum Laboratories, LLC, Springfield, TN (US)

( * ) Notice: Subject to any disclaimer, the term of this patent is extended or adjusted under 35 U.S.C. 154(b) by 0 days.

(21) Appl. No.: 15/708,094

(22) Filed: Sep. 18, 2017

(65) Prior Publication Data
US 2018/0006362 A1 Jan. 4, 2018

Related U.S. Application Data

(63) Continuation-in-part of application No. 15/587,167, filed on May 4, 2017, now Pat. No. 10,003,124.
(Continued)

(51) Int. Cl.
*H01Q 1/24* (2006.01)
*H05K 5/02* (2006.01)
(Continued)

(52) U.S. Cl.
CPC .......... *H01Q 1/243* (2013.01); *H01Q 1/1207* (2013.01); *H01Q 1/2291* (2013.01); *H01Q 21/28* (2013.01);
(Continued)

(58) Field of Classification Search
CPC .... H01Q 1/243; H01Q 1/1207; H01Q 1/2291; H01Q 21/28; H04B 1/38; H05K 5/0221;
(Continued)

(56) References Cited

U.S. PATENT DOCUMENTS 5,055,793 A 10/1991 Mulcahey
5,461,880 A 10/1995 Bolton et al.
(Continued)

FOREIGN PATENT DOCUMENTS

JP 2008107888 A 5/2008

OTHER PUBLICATIONS

International Search Report dated Apr. 5, 2017 in corresponding PCT Patent Application No. PCT/US2016/066675.
(Continued)

*Primary Examiner* — Dameon E Levi
*Assistant Examiner* — David E Lotter
(74) *Attorney, Agent, or Firm* — Waller Lansden Dortch & Davis, LLP; Blake M. Bernard

(57) ABSTRACT

A data communications apparatus is disclosed including a case having a base and a lid connectable to the base, the lid movable with respect to the base between an open position and a closed position. A power supply can be positioned inside the case. A router device can be positioned inside the case, the router device including a plurality of external ports. An antenna array can be positioned inside the case, the antenna array in electrical communication with the router device. An access port can be defined in the case and aligned with the external ports of the router device such that the external ports are accessible through the access port. Electronic devices can be connected to the external ports of the router device from an exterior of the case through the access port.

15 Claims, 21 Drawing Sheets

Related U.S. Application Data which is a continuation of application No. 15/379,219, filed on Dec. 14, 2016, now Pat. No. 9,680,208.

(60) Provisional application No. 62/304,905, filed on Mar. 7, 2016, provisional application No. 62/395,394, filed on Sep. 16, 2016.

(51) Int. Cl.
| | |
|---|---|
| *H05K 7/18* | (2006.01) |
| *H01Q 1/12* | (2006.01) |
| *H01Q 1/22* | (2006.01) |
| *H04B 1/38* | (2015.01) |
| *H01Q 21/28* | (2006.01) |
| *H05K 7/12* | (2006.01) |

(52) U.S. Cl.
CPC ............... *H04B 1/38* (2013.01); *H05K 5/023* (2013.01); *H05K 5/0221* (2013.01); *H05K 5/0239* (2013.01); *H05K 5/0247* (2013.01); *H05K 7/12* (2013.01); *H05K 7/186* (2013.01)

(58) Field of Classification Search
CPC .... H05K 5/023; H05K 5/0239; H05K 5/0247; H05K 7/12; H05K 7/186
See application file for complete search history.

(56) References Cited

U.S. PATENT DOCUMENTS

| | | | |
|---|---|---|---|
| 6,015,072 A | 1/2000 | Young | |
| 6,422,669 B1 | 7/2002 | Salvatori et al. | |
| 7,421,265 B1 * | 9/2008 | Liu | H01Q 21/30 |
| | | | 235/472.01 |
| 2009/0038901 A1 * | 2/2009 | Pomerantz | A45C 13/02 |
| | | | 190/121 |
| 2009/0140020 A1 | 6/2009 | Schlipper | |
| 2010/0197222 A1 | 8/2010 | Scheucher | |
| 2011/0011760 A1 | 1/2011 | Habersetzer | |
| 2011/0279337 A1 | 11/2011 | Corwin et al. | |
| 2012/0235635 A1 * | 9/2012 | Sato | H01Q 1/243 |
| | | | 320/108 |
| 2013/0105354 A1 * | 5/2013 | Wyner | B65D 81/1275 |
| | | | 206/586 |
| 2013/0109449 A1 | 5/2013 | Desclos et al. | |
| 2014/0217862 A1 * | 8/2014 | Rayner | H05K 5/0221 |
| | | | 312/223.1 |
| 2014/0304921 A1 * | 10/2014 | Collins | A47C 27/15 |
| | | | 5/727 |
| 2014/0329458 A1 | 11/2014 | Charette et al. | |
| 2015/0173472 A1 | 6/2015 | Gierke et al. | |
| 2015/0201723 A1 * | 7/2015 | Rayner | G06F 1/1601 |
| | | | 224/191 |
| 2016/0066452 A1 * | 3/2016 | Music | B65D 43/163 |
| | | | 206/742 |
| 2016/0272774 A1 | 9/2016 | Snider et al. | |
| 2017/0024537 A1 * | 1/2017 | Ferlito | G06F 19/3418 |
| 2017/0187107 A1 * | 6/2017 | Charette | H01Q 3/24 |
| 2018/0020793 A1 | 1/2018 | Rao et al. | |

OTHER PUBLICATIONS

Written Opinion dated Apr. 5, 2017 in corresponding PCT Patent Application No. PCT/US2016/066675.

\* cited by examiner

DATA COMMUNICATIONS CASE HAVING AN INTERNAL ANTENNA ARRAY

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application is a continuation-in-part of, and claims the benefit of and priority to, co-pending U.S. patent application Ser. No. 15/587,167 filed on May 4, 2017, entitled DATA COMMUNICATIONS CASE HAVING AN INTERNAL ANTENNA ARRAY, which is a continuation of and claims the benefit of and priority to U.S. patent application Ser. No. 15/379,219 filed on Dec. 14, 2016, entitled DATA COMMUNICATIONS CASE HAVING AN INTERNAL ANTENNA ARRAY, now U.S. Pat. No. 9,680,208, which claims priority to U.S. Provisional Patent Application Ser. No. 62/304,905 filed Mar. 7, 2016 entitled DATA COMMUNICATIONS CASE HAVING AN INTERNAL ANTENNA ARRAY and U.S. Provisional Patent Application Ser. No. 62/395,394 filed Sep. 16, 2016 entitled DATA COMMUNICATIONS CASE HAVING AN INTERNAL ANTENNA ARRAY, each of the above noted applications being incorporated herein by reference in their entireties.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

This present disclosure generally relates to the field of data communications.

More specifically, the present disclosure relates to facilitating various types of communications, including secure, high-speed data communications, and voice communications when current end user devices may detect that little or no wireless or voice signal is available. Network failures and slow data communications occur for a myriad of reasons—from crowded networks to natural disasters—leading to frustrations in a society that is growing ever dependent on the ability to transmit and receive communications, including secure, high-speed data. Further, obtaining data and voice communication in remote areas without readily available power supplies, internet connectivity, and/or where cellular coverage is weak or non-existent can be difficult if not impossible, which can be especially undesirable for public safety officials and others that often rely on data and voice communications for work projects in rural environments and in disaster relief situations.

Conventional data communication units are large, bulky, and difficult to transport, and thus are typically retained in a generally fixed or permanent location. Additionally, conventional, portable antennas are typically located on the outside of a data communications unit, creating a cumbersome device that is not aesthetically pleasing, where the antennas are freely exposed to external wear, tear and breakage.

What is needed then are improvements to data communication units.

BRIEF SUMMARY

This Brief Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

One aspect of the present disclosure is a data communications apparatus including a case having a base and a lid connectable to the base, the lid movable with respect to the base between an open position and a closed position. A power supply can be positioned inside the case. A router device can be positioned inside the case, the router device including a plurality of external ports. In some embodiments, the external ports can be external Ethernet ports. An antenna array can be positioned inside the case, the antenna array in electrical communication with the router device. An access port can be defined in the case and aligned with the external ports of the router device such that the external ports are accessible through the access port. Other electronic devices can be connected to the external ports of the router device from an exterior of the case through the access port.

In some embodiments, the power supply and the router device can be positioned inside the base, and the antenna array can be secured inside the lid. The access port can also be defined in the base. In some embodiments, the apparatus can further include a base foam cushion positioned in the base and a lid foam cushion positioned inside the lid. In some embodiments, the base foam cushion can at least partially surround the power supply and the router device, and the lid foam cushion can at least partially surround the antenna array. In some embodiments, the apparatus can include an annular gasket positioned on the case, the annular gasket forming a seal between the base and the lid when the lid is in the closed position.

In some embodiments, the antenna array can include a least two cellular antennas and at least two wireless networking antennas. The data communications apparatus of the present disclosure can be utilized in one application in various vertical markets for failover when there is a power outage or the Wide Area Network (WAN) is down. The data communications apparatus of the present disclosure can also be used in areas where cellular coverage may appear to be weak or even non-existent in order to amplify or increase the wireless or voice signal detected by an end user device, such as a phone, tablet, or laptop. The data communications apparatus of the present disclosure may also be deployed for events, such as sales meetings, sporting, entertainment or news events, etc.

One objective of the present disclosure is to provide a portable data and voice communications system that allows for reliable wireless and cellular communications and/or GPS location services when power outages or signal disruptions occur.

Another objective of the present disclosure is to provide a portable, data and voice communications system that allows for reliable wireless and cellular communications and/or GPS location services in areas where signal strength is weak or nonexistent.

Another objective of the present disclosure is to allow for greater mobility and durability for portable data and voice communications systems. In conventional portable data and voice communications systems, antennas have not been housed inside protective carrying cases and thus have not been capable of withstanding significant impact.

Another objective of the present disclosure is to help increase the aesthetic appearance of portable data communications system. Rather than carrying a data communications case with bulky antennas on the outside of the case often prone to snagging or being broken, the apparatus of the present disclosure can help provide the power and speed provided by large, bulky antennas with the benefit of an aesthetically pleasing case.

Numerous other objects, advantages, and features of the present disclosure will be readily apparent to those of skill in the art upon a review of the following description of certain embodiments, including the drawings and figures attached hereto.

DETAILED DESCRIPTION

Figure 1:
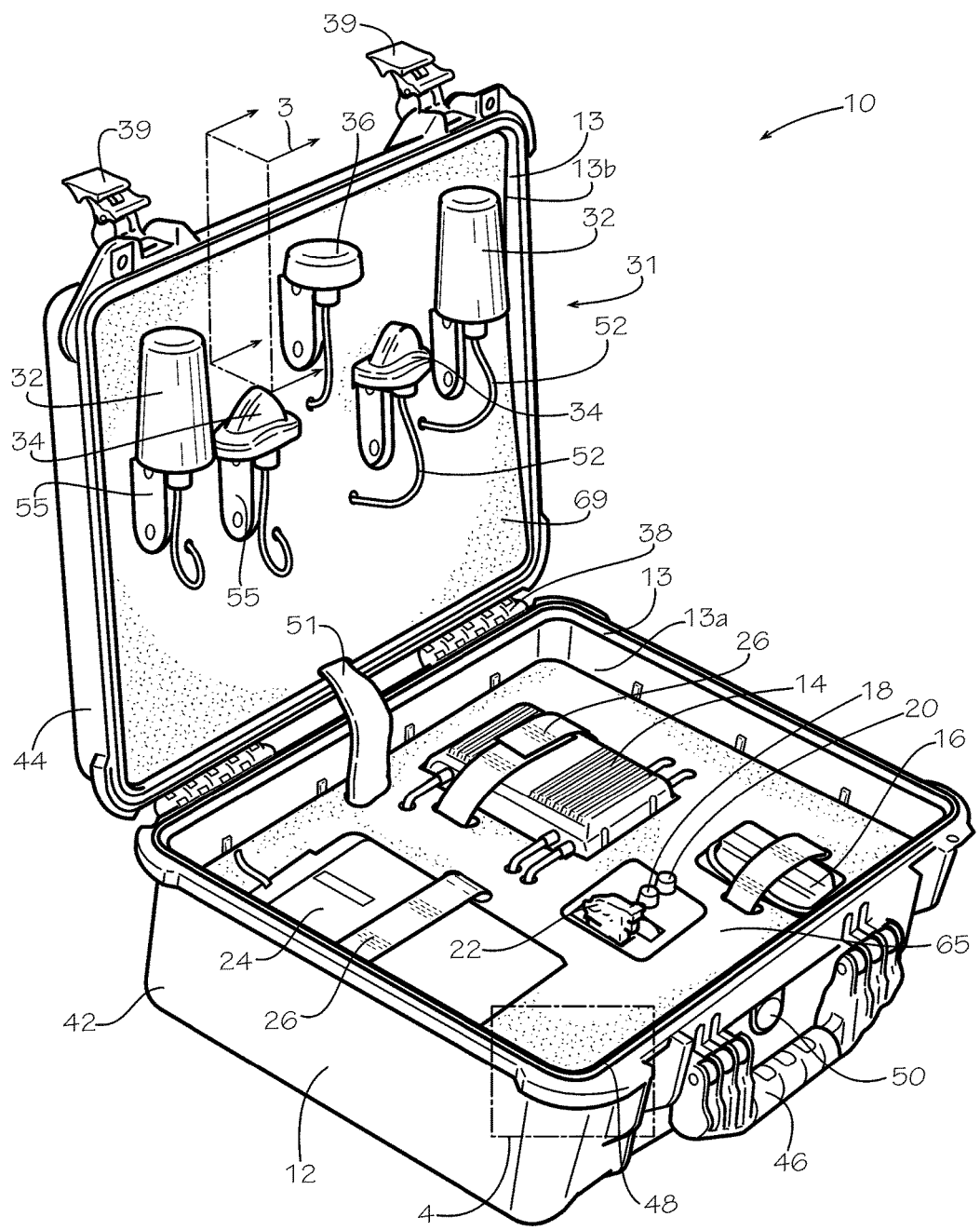
FIG. 1 is a perspective view of an embodiment of a data communications apparatus of the present disclosure with a lid of the apparatus in an open position to provide access to internal components of the apparatus.

While the making and using of various embodiments of the present invention are discussed in detail below, it should be appreciated that the present invention provides many applicable inventive concepts that are embodied in a wide variety of specific contexts. The specific embodiments discussed herein are merely illustrative of specific ways to make and use the invention and do not delimit the scope of the invention. Those of ordinary skill in the art will recognize numerous equivalents to the specific apparatus and methods described herein. Such equivalents are considered to be within the scope of this invention and are covered by the claims.

In the drawings, not all reference numbers are included in each drawing, for the sake of clarity. Positional terms used herein such as "upper," "lower," "side," "top," "bottom," etc. refer to the apparatus when in the orientation shown in the drawing that is being referred to in the accompanying description. A person of skill in the art will recognize that the apparatus can assume different orientations when in use.

Figure 2:
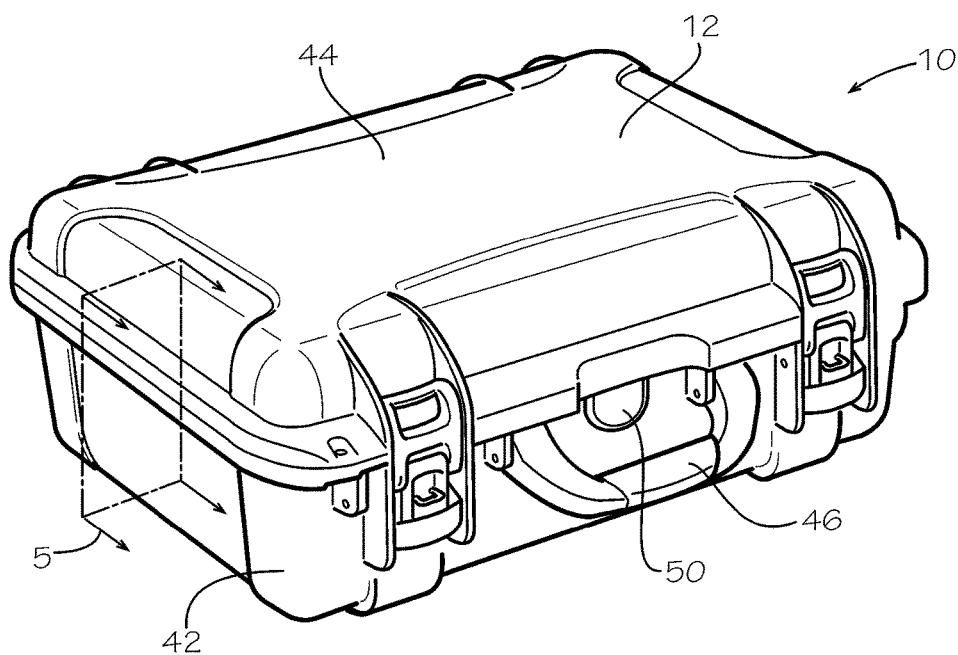
FIG. 2 is a perspective view of the data communications apparatus of FIG. 1 with the lid in the closed position.

An embodiment of the data communications apparatus 10 containing various components is shown in FIG. 1. Apparatus 10 can include a case 12 including a base 42 and a lid 44 connectable to base 42. Lid 44 can be movable with respect to base 42 between an open position and a closed position. In FIG. 1, lid 44 is shown pivotally connected to base 42 via hinge 38, such that lid 44 can rotate with respect to base 42 between an open and a closed position. One or more latches or clasps 39 can secure lid 44 to base 42 when lid 44 is in the closed positon, as shown in FIG. 2. In other embodiments, lid 44 can be detachable from base 42 such that lid 44 can be connectable on base 42 and secured thereto via two or more latches or clasps 39 positioned around the periphery of case 12. Moving lid 44 from a closed position, as shown in FIG. 2, to an open position, as shown in FIG. 1, can provide a user access to the internal components of case 12. Case 12 can include a handle 46 which can be grasped by a user to facilitate carrying apparatus 10 and case 12.

Figure 3:
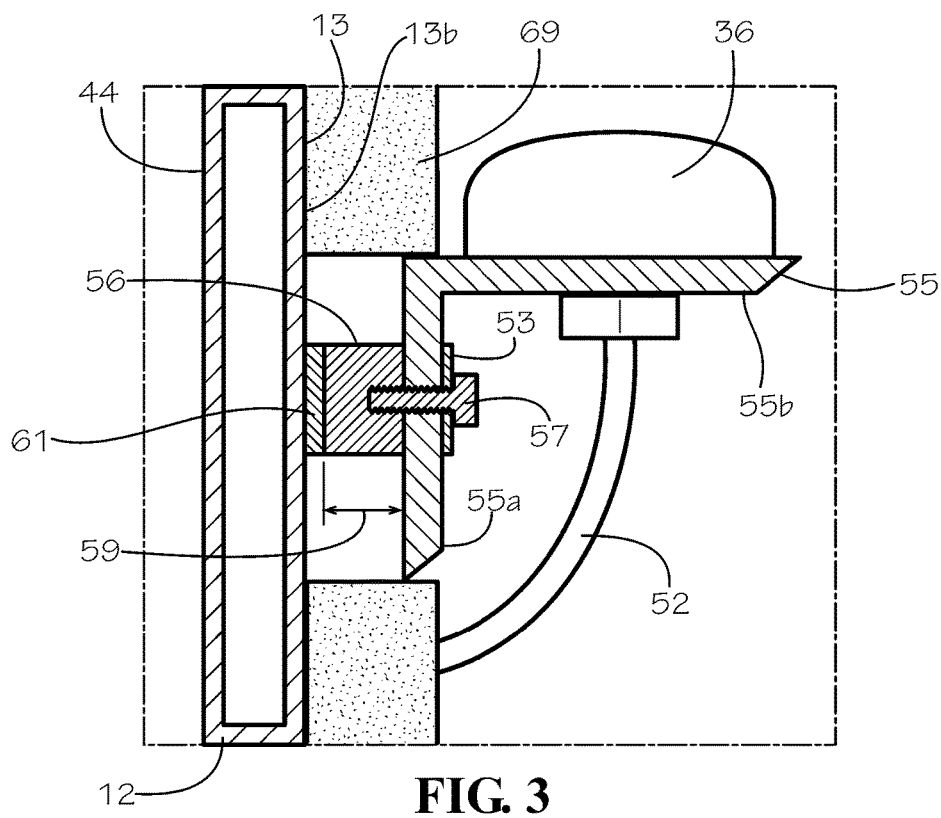
FIG. 3 is a detailed cross section view of another embodiment of a data communications case of the present disclosure having hollow case sidewalls, the apparatus having an antenna mounted to a mounting bracket and the mounting bracket adhered to an inner side of a lid of the apparatus.
Figure 5:
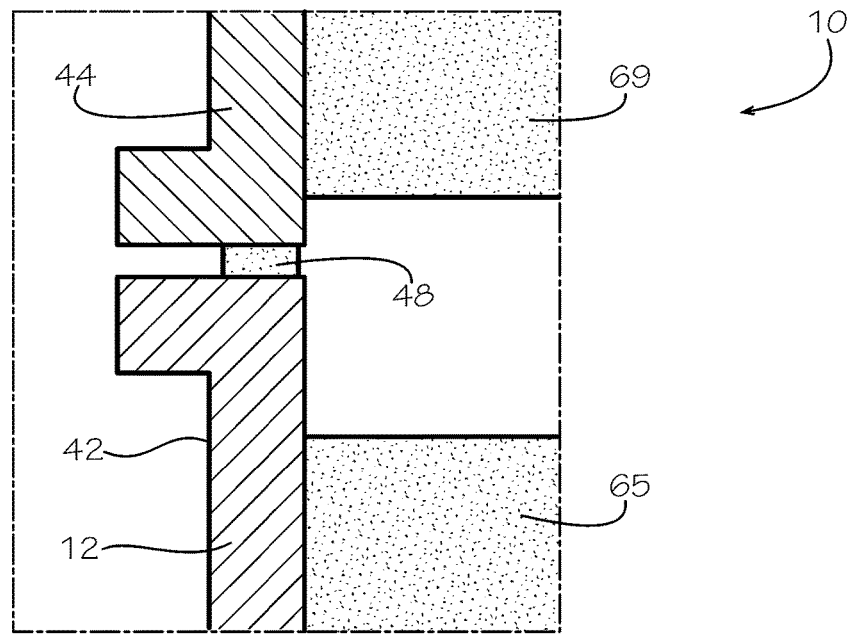
FIG. 5 is a cross section view of the apparatus of FIG. 2 showing the annular gasket compressed between the lid and the base of the apparatus.
Figure 6:
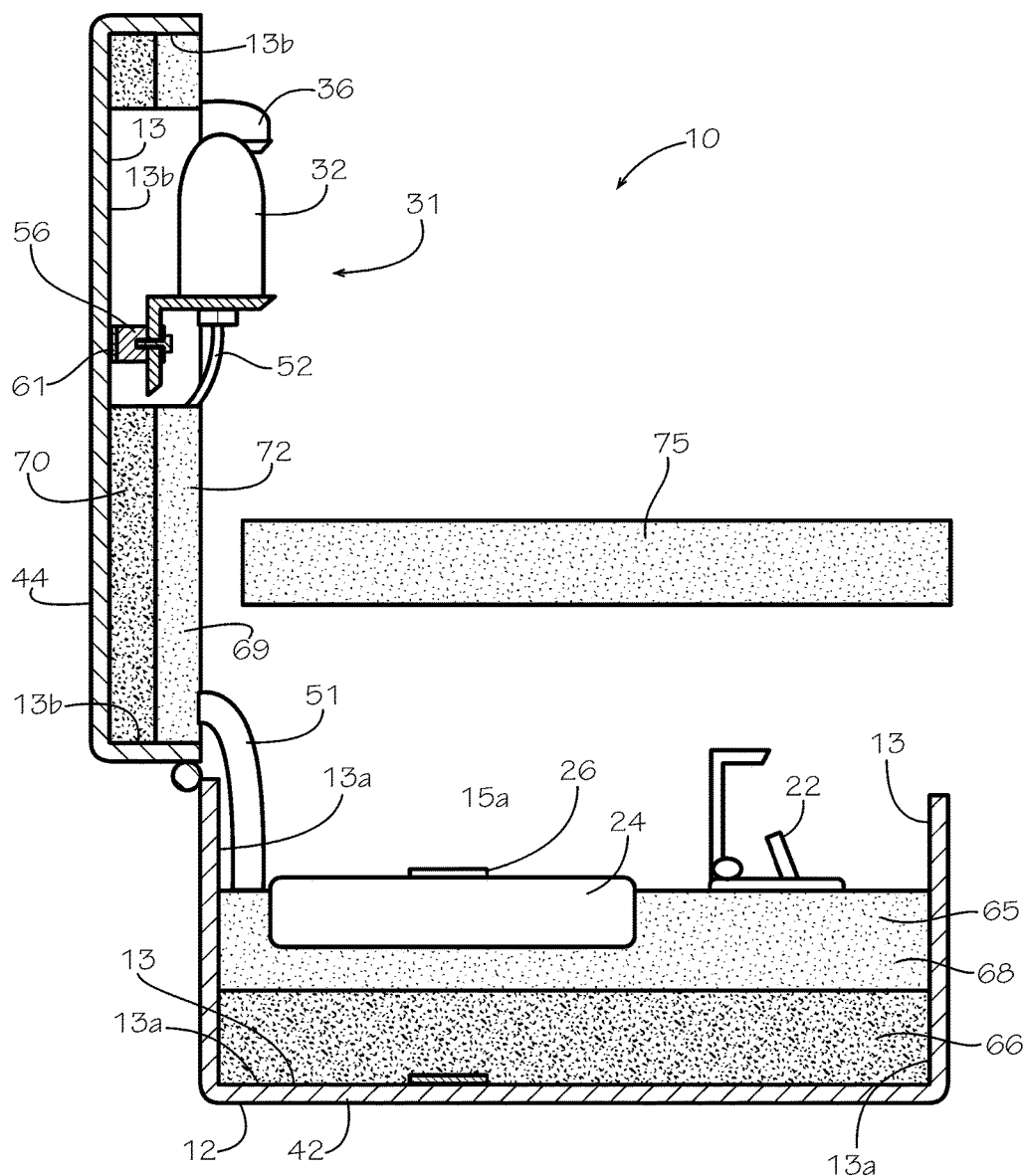
FIG. 6 is a cross section view of the apparatus of FIG. 1 with the lid of the apparatus in an open position.

In some embodiments, the sidewalls of case 12 can be a hollow structure having an inner and an outer shell as shown in FIG. 3. The outer and inner shells of case 12 can be made from any suitable material, including but not limited to polypropylene, which can help provide impact resistance, waterproofing, crush-proofing, and dustproofing characteristics to case 12. The outer and inner shells of case 12 may also comprise various other polymers including polyethylene, high-density polyethylene, polyurethane, polyester, nylon, silicone rubber, polycarbonates, and various other polymers known in the art. In some embodiments, case 12 can be a solid structure having a single, thicker shell, as shown in FIGS. 5-6. As shown in FIG. 6, case 12 can include an inner surface 13, which can include base inner surface 13a and lid inner surface 13b. Base inner surface 13a can define a base cavity 15a, and lid inner surface 13b can define a lid cavity 15b. Components contained within case 12 can be positioned in either base cavity 15a or lid cavity 15b.

Figure 4:
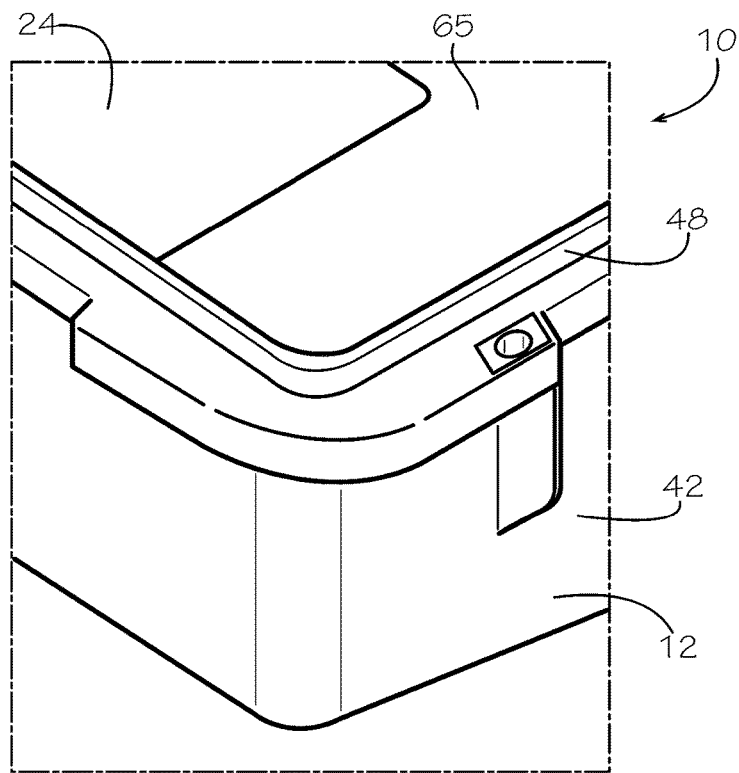
FIG. 4 is a detailed perspective view of the apparatus of FIG. 1 showing an annular gasket positioned on a base of the apparatus.

In some embodiments, apparatus 10 can include an annular gasket 48 positioned on case 42, shown in FIGS. 1 and 4-5. When lid 44 is in the closed position, annular gasket 48 may be compressed between lid 44 and base 42 to form an annular seal between base 42 and lid 44. The annular seal formed by annular gasket 48 can be a waterproof seal such that when lid 44 is in a closed position, annular gasket 48 can help protect the internal components of apparatus 10 from exposure to liquids, as well as dust and other potential contaminants. Annular gasket 48 can be made from a rubber or elastomer material, or any other suitable material for forming a seal between base 42 and lid 44. Annular gasket 48 can help ensure that pressure equalization within case 12 is maintained. In some embodiments, case 12 may include an automatic-pressure release valve 50. As apparatus 10 is operated, heat can be generated inside case 12 which can increase the pressure inside case 12. Pressure relief valve 50 can be configured to sense or determine the pressure inside case 12, and automatically open to release pressure within case 12 when the pressure exceeds a predetermined threshold.

In certain embodiments, case 12 meets or exceeds U.S. military specifications for ruggedized equipment. For the embodiment shown in FIG. 1, the interior dimensions of case 12 are approximately 18.0-20.0 inches in length by 12.0-14.0 inches in width by 6.0 to 8.0 inches in height; and the exterior dimensions of case 12 are approximately 19.0-21.0 inches in length by 15.0-17.0 inches in width by 7.0-9.0 inches in height. For the embodiment shown in FIG. 1, the weight of case 12 when empty is approximately six to eight pounds. The size and weight of case 12 can be varied in different applications to increase or decrease the size and weight of case 12 and apparatus 10 as desired for different uses and to accommodate varying numbers of internal components as necessary. A case designed to be easily portable and easy to transport can be beneficial in various situations and applications, for instance when used by emergency responders and other public safety officials who can conveniently transport apparatus 10 to disaster relief areas or other remote areas without power, wireless service, and/or voice service. The size and weight of case 12 and apparatus 10 can also be varied for business and sales persons that may travel frequently and desire to have ready access to data and voice communications capabilities.

Referring again to FIGS. 1 and 6, apparatus 10 can include a router device 14 secured within case 12, and a rechargeable wireless power supply 24 secured within case 12. Router device 14 can selectively receive power from power supply 24. Apparatus 10 can include an AC/DC adapter 16. Power supply 24 can be connected to adapter 16 and adapter 16 can be plugged into an external power grid in order to recharge power supply 24 between uses of apparatus 10, or while apparatus 10 is being used and power supply 24 is depleted. In some embodiments, apparatus 10 can include a second power source which can be a second standalone power source such as a battery or load cell which can be connected to power source 24. A second standalone power source can help prolong the usable life of apparatus 10 when apparatus 10 is used in remote area or areas without access to a utility power grid. In some embodiments, the second standalone power source can be configured to provide multiple days of additional power to apparatus 10. In some embodiments, the second external power source can be contained in its own, waterproof protective case such that the second standalone power source is protected as described herein. Case 12 and the case for the second standalone power source can be positioned side by side or on top of one another and the secondary power source can be connected to power source 24.

A power switch 22, a main fuse 18, and an auxiliary fuse 20 can also be secured within case 12. Power switch 22 can be in electrical communication with power supply 24 and router device 14 and can be selectively toggled by a user to turn on apparatus 10 and supply power from power supply 24 to router device 14. Main fuse 18 and auxiliary fuse 20 can be utilized to power additional electrical devices if desired, for instance external lighting sources, which can be beneficial in times of power outages or in remote locations away from electrical power grids. Power supply 24, router device 14, power switch 22, main fuse 18 and auxiliary fuse 20 can be connected to one another by low voltage (approximately 9V to 36V) electrical wiring that is coated with a suitable insulating material (e.g., flame-retardant polyvinyl chloride), having an approximate thickness of 0.007-0.011 inches. An insulated coating on the electrical wiring can help reduce electromagnetic interference between the wiring, as well as with other electrical components of apparatus 10.

In certain embodiments, router device 14 comprises a built-in modem, a cellular gateway, WAN/LAN switchable ports, and a wireless network adapter. In certain embodiments, router device 14 is capable of utilizing a firewall to block unauthorized access to communications sent and/or received via router device 14. In certain embodiments, router device 14 is capable of enabling multiple, segmented wireless networks, which can either be public or private wireless networks. The multiple wireless networks may have separate and different service set identifiers (SSIDs), each of which may be defined with passcodes. It is advantageous that router device 14 be capable of encrypting data communications via various encryption protocols (e.g., encrypting WiFi communications with WEP, WPA, WPA2, etc.). It may also be advantageous that router device 14 be programmable to allow for load balancing.

Further, each wireless network may be capable of having multiple users. In some embodiments, each wireless network and SSID can simultaneously accommodate multiple users. In some embodiments, router device 14 can enable multiple separate wireless networks and SSIDs, such that apparatus 10 can accommodate additional users on the separate wireless networks. Router device 14 may utilize either static or dynamic IP addressing schemas. In certain embodiments, router device 14 may enable 802.11 wireless connectivity utilizing distinct wireless frequencies (e.g., 2.4 GHz, 3.6

GHz, 4.9 GHz, 5 GHz, or 5.9 GHz). In certain embodiments, router device 14 may enable 802.11 wireless connectivity in a, b, g, n, and/or ac standard configurations. In certain embodiments, router device 14 may be programmed via a cloud based device manager. In certain embodiments, router device 14 can include multiple cellular gateways such that router device 14 may accommodate and communicate with more than one cellular carrier.

Figure 7:
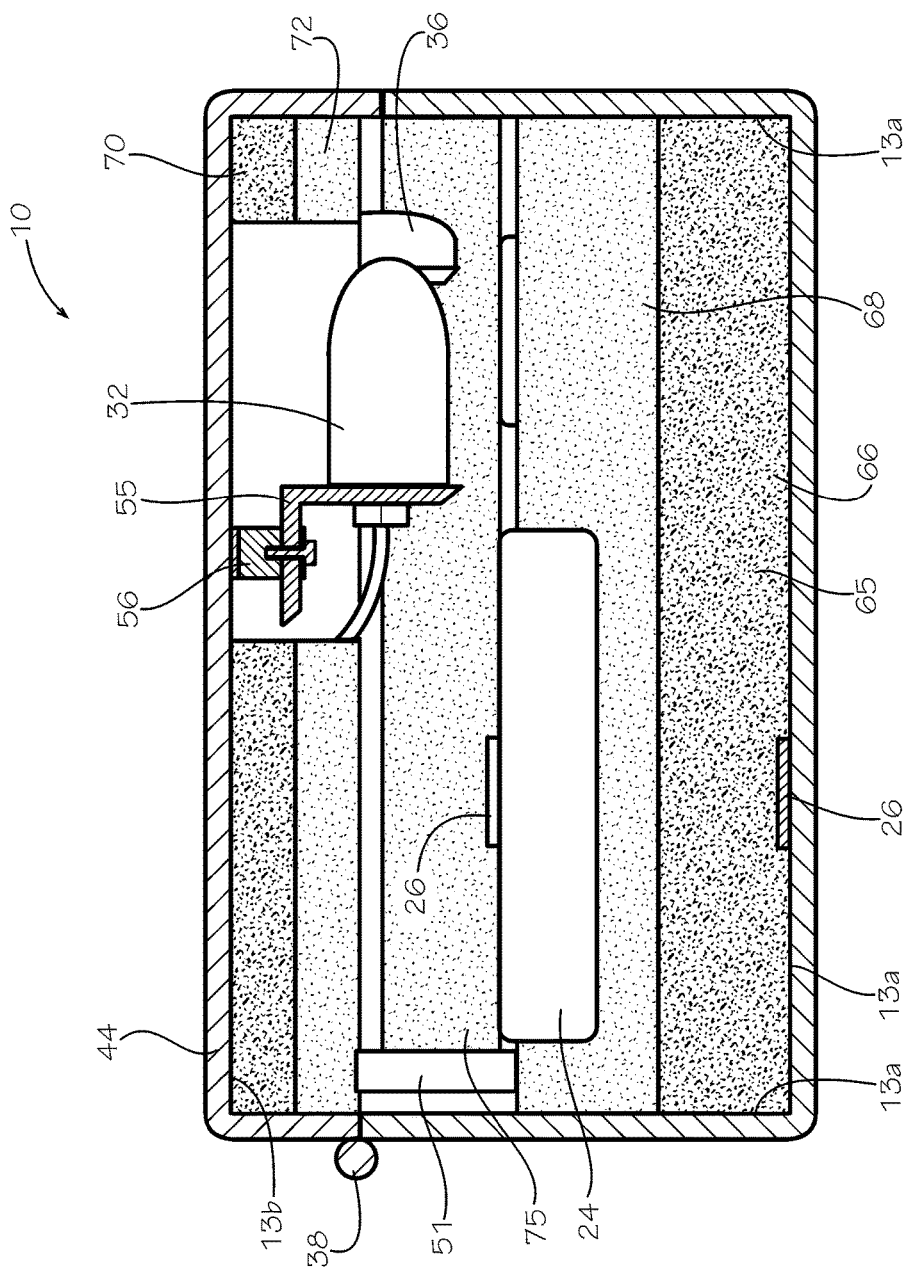
FIG. 7 is a cross section view of the apparatus of FIG. 6 with the lid of the apparatus in a closed position.
Figure 12:
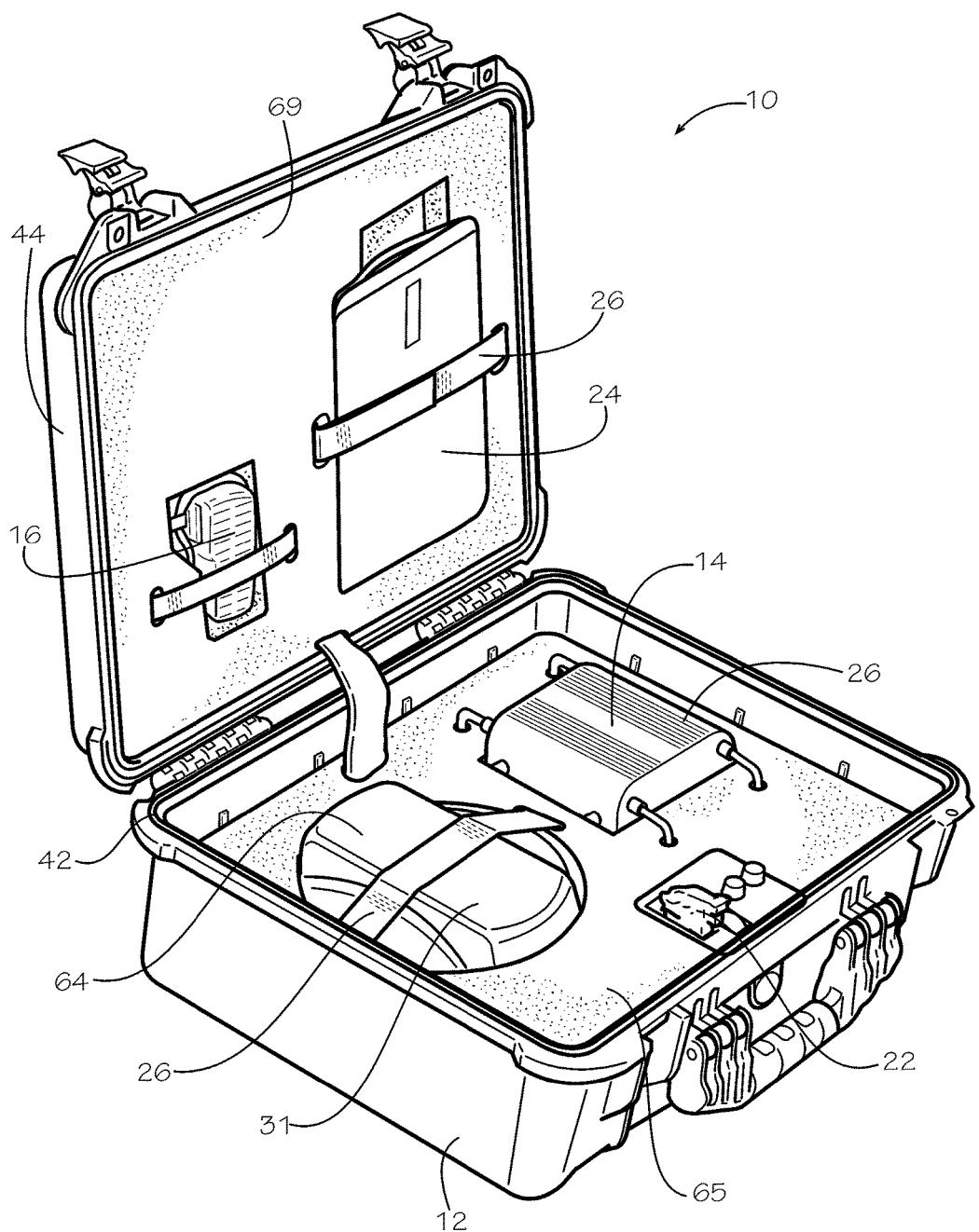
FIG. 12 is a perspective view of another embodiment of a data communications apparatus of the present disclosure having an antenna array with multiple antennas contained within an antenna housing.

In certain embodiments, router device 14 may have multiple WAN/LAN/RJ-45 ports for failover if a user wishes to directly connect to router device 14. In certain embodiments, router device 14 may comprise a Gobi® radio An antenna array 31 can be in electrical communication with router device 14. Antenna array 31 can include one or more cellular antennas 32, one or more wireless network (e.g. Wi-Fi®) antennas 34, and at least one global positioning system (GPS) antenna 36 secured, retained within, or attached to an inside surface 13 of case 12. In certain embodiments, antennas 32, 34, and 36 of antenna array 31 may be attached to lid inside surface 13b of lid 44, as shown in FIGS. 1 and 6. In other embodiments, as shown in FIG. 12, antenna array 31 can be secured in, retained within, or attached to base 42 of case 12. In some embodiments, each antenna 32, 34, and 36 of antenna array 31 can be separately mounted or attached within case 12, as shown in FIG. 1. In other embodiments, each of the antennas of antenna array 31 can be contained together in an antenna housing 64, and antenna housing 64 can be contained within or attached to either base 42 or lid 40 of case 12 at a single location, as shown in FIG. 12. The location of antenna array 31 inside case 12 is beneficial because conventional, portable antennas are typically located on the outside of a data communications unit, creating a cumbersome device that is unaesthetically pleasing where the antennas are freely exposed to external wear, tear and breakage. In contrast, antennas 32, 34, and 36, as well as the other electrical components of apparatus 10 are protected by case 12 when lid 44 is in the closed position, which can help prevent damage to the integral electrical and/or communication components of apparatus 10. When lid 44 is in the closed position, case 12 can enclose and protect power supply 24, router device 14, and antenna array 31, as shown in FIGS. 2 and 7.

Figure 9:
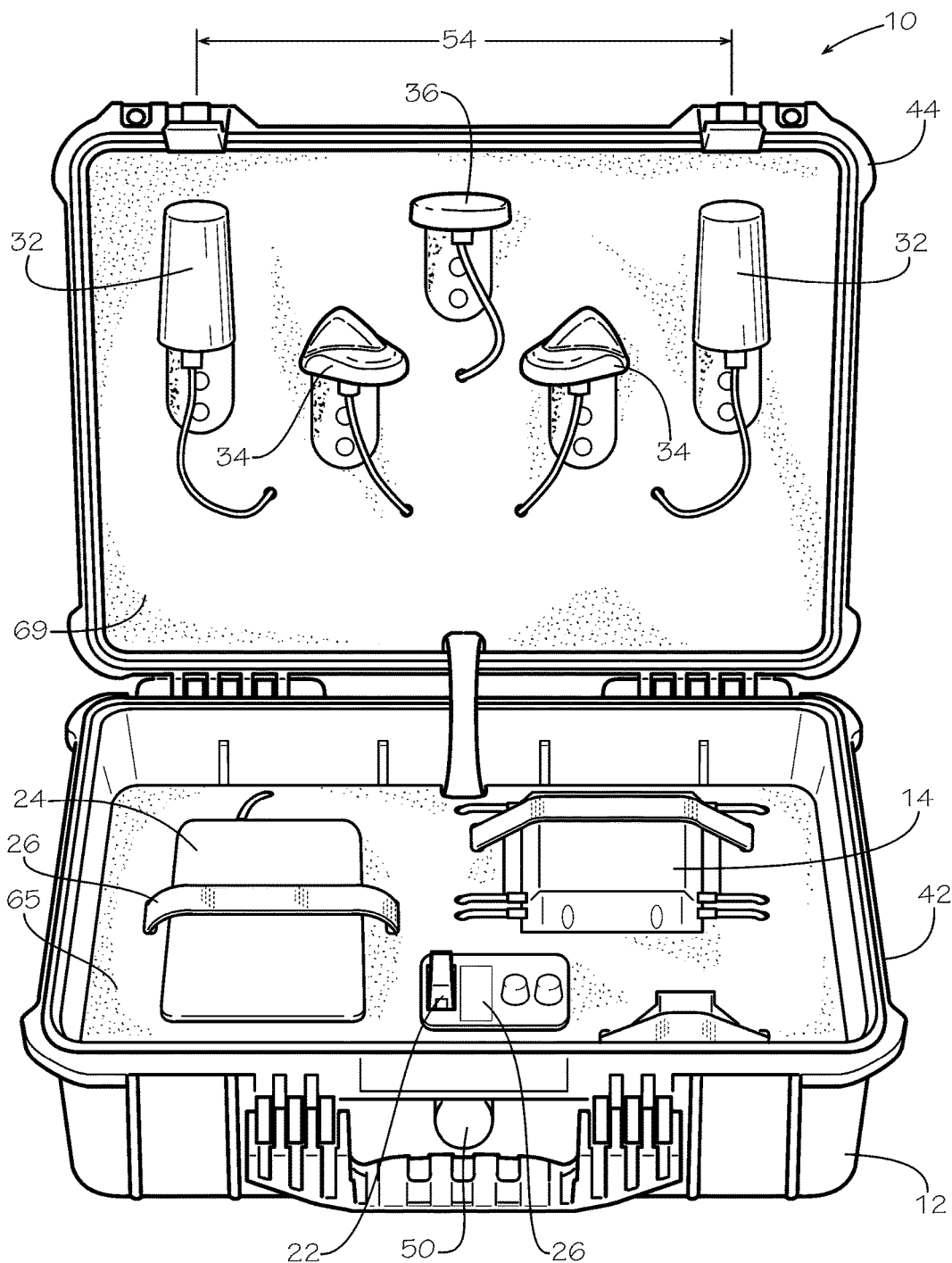
FIG. 9 is a front view of the apparatus of FIG. 1.

In the embodiment shown in FIG. 1, two cellular antennas 32 are utilized to cover frequencies across 700 and 800 MHz as well as all global cellular frequencies from 698-960 MHz and 1710-2700 MHz. Cellular antennas 32 of the embodiment in FIG. 1 may require a ground plane. For the embodiment shown in FIG. 1 and discussed above, It has been discovered that vertical polarity cellular antennas requiring a ground plane may be particularly advantageous. Ground plane independent cellular antennas and horizontal polarity cellular antennas, however, may also be used in other embodiments. Cellular antennas 32 of the embodiment in FIG. 1 may allow for multiple user and multiple-input and multiple-output (MiMo) applications. As shown in FIG. 9, cellular antennas 32 can be positioned at a cellular antenna separation distance 54 from one another within case 12 to help reduce frequency interference between cellular antennas 32. In one embodiment, cellular antenna separation distance 54 is at least 12 inches.

In certain embodiments, GPS antenna 36, as shown in FIG. 1, can be included in the data communications case. In one embodiment, the GPS antenna has an operating frequency of 1575 MHz, but many other operating frequencies may be utilized. In one embodiment, GPS antenna 36 can have a low-noise amplifier gain of 26 decibels, and an impedance of 50 ohms. A plurality of GPS antennas may be used. The GPS antenna(s) may be active or passive GPS antennas.

In certain embodiments, the wireless antennas 34, as shown in FIG. 1, have a frequency range of 2.4/5 GHz. In certain embodiments, the wireless antennas 34 enable multiple user and multiple-input and multiple-output applications. In certain embodiments, a user may be able to utilize a virtual private network (VPN) with any combination of the multiple wireless networks and/or any wired network port. In certain embodiments, more than two wireless antennas can be used to further increase the capacity of the wireless network and to further support MiMo applications.

Antenna cables 52 may connect various components inside the case 12 to the antennas 32, 34, 36. The antenna cables 52 may be channeled through a conduit 51, which allows for discrete and organized bundling of the antenna cables 52 and other cables connecting components within the case. Various components inside the case 12 may also be interconnected wirelessly. It is advantageous to utilize cables having as short as a length as possible to avoid attenuation. It is also advantageous to utilize low attenuation cables.

In certain embodiments, as shown in FIGS. 1, 3, and 6, antennas 32, 34, 36 are securely mounted within case 12 to lid inside surface 13b of lid 44. Apparatus 10 can include a plurality of mounting brackets 55 which can be adhered to lid inside surface 13b. Each antenna 32, 34, and 36 of antenna array 31 can be secured inside lid 44 to a corresponding mounting bracket 55. In some embodiments, each mounting bracket 55 can be substantially L-shaped. A first bracket portion 55a of bracket 55 can be positionable substantially parallel to lid inside surface 13b, first bracket portion 55a being adhered to lid inside surface 13b. A second bracket portion 55b can extend away from lid inside surface 13b when mounting bracket 55 is adhered to lid inside surface 13b. A corresponding antenna, shown as GPS antenna 36 (by way of example only) in FIG. 3, can be mounted to second bracket portion 55b. In one embodiment of the invention, second bracket portion 55b may be shaped and sized to serve as a ground plane for any one or more than one of the antennas of the antenna array.

In certain embodiments, as shown in FIG. 3, each mounting bracket 55 can include at least one resilient polymer stud 56 having a stud length 59. Polymer studs 56 can be adhered to an inner surface 13 of case 12, and in some embodiments to lid inner surface 13b, and to first bracket portion 55a of a corresponding mounting bracket 55 such that mounting brackets 55 are adhered to lid inner surface 13b via polymer studs 56. Particularly, one end of each stud 56 can be adhered to lid inner surface 13b, and an opposing end of each stud 56 can be attached or adhered to first portion 55a of a corresponding mounting bracket 55. In some embodiments, as shown in FIG. 3, each mounting bracket 55 can have an internal grommet or hole within the first portion 55a of mounting bracket 55 and each polymer stud 56 can have a threaded receptacle such that first portion 55a of mounting bracket 55 can be secured to polymer stud 56 by a screw, bolt, or other suitable fastener 57. In some embodiments, a washer 53 can be positioned between mounting bracket 55 and fastener 57 to help disperse the force of fastener 57 against mounting bracket 55.

In other embodiments, one end of each stud 56 can be adhered to lid inner surface 13b, and an opposing end of each stud 56 can be adhered to first portion 55a of a corresponding mounting bracket 55. In still other embodiments, each polymer stud 56 and corresponding mounting bracket 55 can be integrally formed together as one continuous or unitary piece.

In certain embodiments, studs 56 can have a circular longitudinal cross section including a diameter of at least 0.5 inches and a stud length of at least 0.5 inches. In some embodiments, studs 56 can have a diameter of about 0.825 inches and a length of about 1.25 inches. Studs 56 can therefore extend inward from lid inner surface 13b a distance of at least 0.5 inches. Studs 56 can be comprised of a resilient polymer capable of dampening shock and vibration, such as polychloroprene. In certain embodiments, each stud 56 may be secured to lid inner surface 13b of lid 44 by a structural adhesive 61, such as a structural cyanoacrylate. One example of a suitable structural cyanoacrylate adhesive is BP Blue™, which can be purchased from Tech-Bond Solutions™ of Columbus, Ohio. In certain embodiments, the opposite ends of each stud 56 can also be secured to corresponding mounting brackets 55 via a similar structural adhesive, such as the structural cyanoacrylate discussed herein. While other mechanisms may be used to secure the antennas within case 12, structurally adhering studs 56 to corresponding inner surface 13 of case 12 via structural adhesives such as structural cyanoacrylates can allow antennas 32, 34, and 36 to be secured within case 12 without having to penetrate case 12.

Referring again to FIGS. 1 and 3, mounting brackets 55 used to secure antennas 32, 34, and 36 within case 12 should be configured to allow for secure placement of antennas 32, 34, and 36 on corresponding mounting brackets 55 via suitable antenna fasteners (e.g., screws, nuts, bolts) and to provide any necessary ground plane for antennas 32, 34, and 36. Mounting brackets 55 and the fasteners used to hold antennas 32, 34, and 36 in place on corresponding mounting brackets 55 within case 12 may include powder coated steel or stainless steel.

Mounting brackets 55 can be positioned at a predetermined distance away from the inside of case 12 via polymer studs 56, in some embodiments a distance of at least 0.5 inches, such that antennas are located at a sufficient distance from lid inner surface 13b of lid 44 so that case 12 may be comfortably closed, and so that antenna array 31 may have unimpeded, open-air exposure when lid 44 is in the open position. Affixing antennas 32, 34, and 36 to mounting brackets 55 on inner surface 13 of case 12 can allow for case 12 to be waterproof and dustproof and can help reduce the problem of antennas 32, 34, and 36 being easily dislocated or knocked off a data communications unit.

Figure 8:
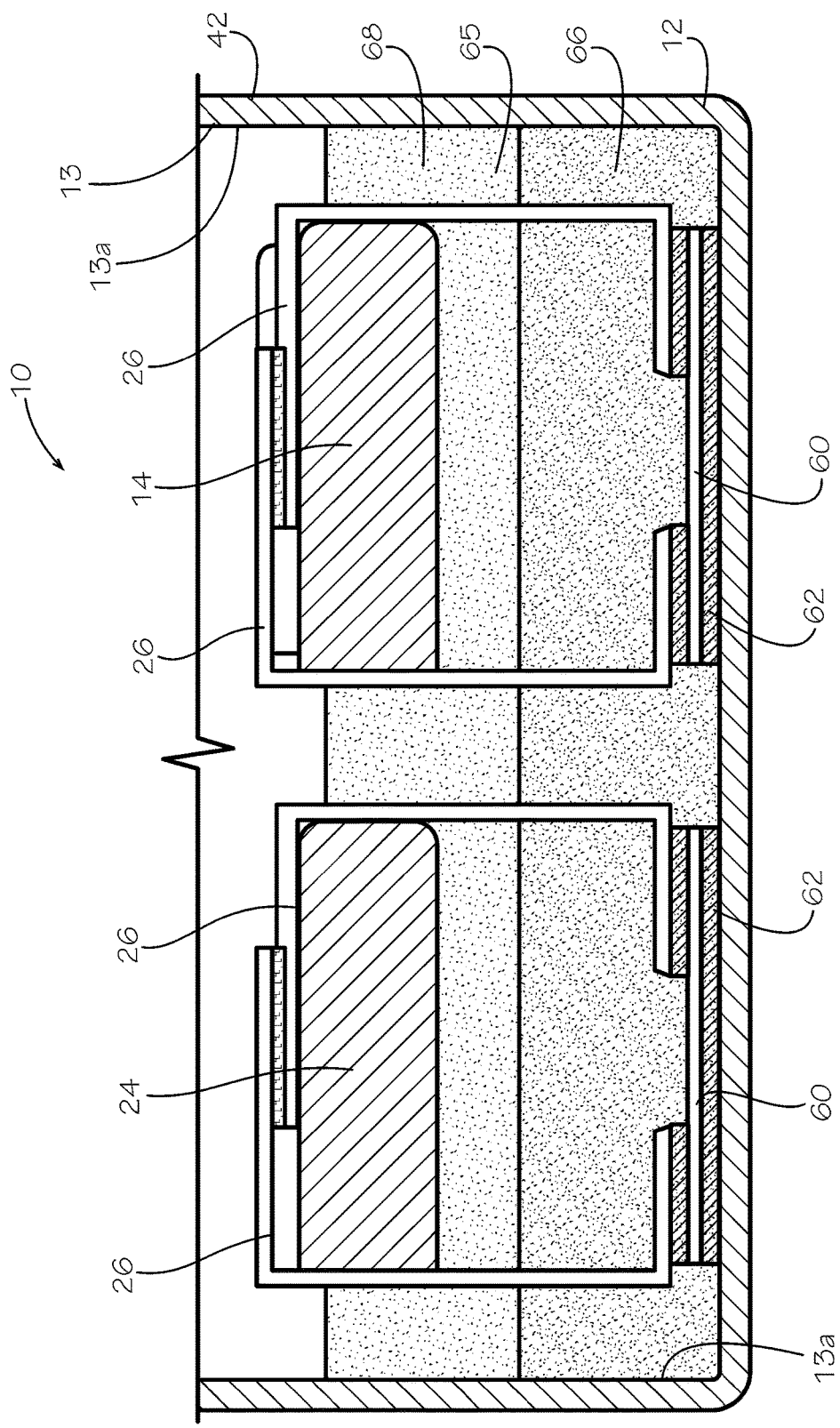
FIG. 8 is a cross section view of the base of FIG. 1 showing one or more fastening straps adhered to an inner side of the case and secured around corresponding internal components of the apparatus.

As shown in FIGS. 1 and 8, Apparatus 10 can include a plurality of fastening straps 26 adhered to case 12. Each of power supply 24, router device 14, and power switch 22 can be secured within case 12 with at least one corresponding fastening strap 26. Fastening straps 26 may incorporate hook and loop fasteners, zippers, removable adhesives, buttons, snaps, clips, or any other suitable fastening members to secure fastening straps 26 together around corresponding components of apparatus 10 to secure the components within case 12. Fastening straps 26 in some embodiments can include audible snap closures. Fastening straps 26 can be adhered or structurally bonded to either base 42 or lid 44 as desired to secure the various components of apparatus 10 to either base 42 or lid 44.

In some embodiments, fastening straps 26 may be sewn, adhered, or otherwise attached to corresponding polymer strips 60. Polymer strips 60 can be adhered to inside surface 13 of case 12 by a polymer strip structural adhesive 62 such as a structural cyanoacrylate. As such, fastening straps 26 can be adhered to case 12 via polymer strips 60. A polymer strip structural adhesive 62 including a structural cyanoacrylate can form a covalent bond between polymer strips 60 and inside surface 13 of case 12 to help provide a strong and reliable attachment of polymer strips 60 to case 12. Adhering polymer strips 60 and fastening straps 26 to case 12 can help maintain the integrity of case 12 as polymer strips 60 and fastening straps 26 are not secured to case 12 by mechanical fasteners such as screws or bolts that can penetrate case 12.

In some embodiments, fastening straps 26 may be sewn to the polymer strips 60 using sewing thread that meets or exceeds U.S. military specifications. In other embodiments, fastening straps 26 can be adhered to polymer strips 60. In still other embodiments, the fastening straps 26 may be adhered directly to inner surface 13 of case 12.

Polymer strips 60 may comprise polychloroprene, nylon-reinforced polychloroprene, or another suitable polymer. Polymer strips 60 made of nylon-reinforced polychloroprene have been found to be particularly advantageous.

In some embodiments, as shown in FIG. 1, router device 14, power supply 24, and power switch 22 can be secured in base 42 via suitable fastening strips 26, and each antenna 32, 34, and 36 of antenna array 31 can be secured within lid 44 via a corresponding mounting bracket 55. In other embodiments, as shown in FIG. 12, one or more of power supply 24 and/or router device 14 can be secured in lid 44 via fastening strips 26, and antenna array 31, positioned within antenna housing 64, can be secured within base 42 by fastening straps 26.

Referring again to FIG. 1, and also shown in FIG. 6, the communications components positioned within case 12 can be further secured and protected within case 12 by a base foam cushion 65 positioned within base 42, and a lid foam cushion 69 positioned within lid 44. Foam cushions 65 and 69 can at least partially surround or support components positioned within base 42 and lid 44 respectively. Foam cushions 65 and 69 can be oriented and shaped to allow a surface of respective components positioned in base 42 and lid 44 to be exposed when lid 44 is in the open position for ease of operation of apparatus 10, as shown in FIG. 1. In some embodiments, base foam cushion 65 and lid foam cushion 69 can each include open cell foam having a foam density greater than or equal to 2 pounds per cubic foot. In some embodiments, base foam cushion 65 and lid foam cushion 69 can each include open cell foam having a foam density greater than or equal to about 4 pounds per cubic foot.

In certain embodiments, apparatus 10 can include an additional removable cushion 75 placeable between lid 44 and base 42 when lid 44 is moved to the closed position, as shown in FIGS. 6 and 7. Removable cushion 75 can help prevent interference and damage between components positioned in base 42 and components positioned in lid 44 when lid 44 is moved to the closed position. Removable cushion 75 can generally pad the components contained in case 12 when lid 44 is in the closed position.

Each of foam cushions 65 and 69 may include multiple layers in some embodiments. In certain embodiments, at least one of the foam layers in each foam cushion 65 and 69 can have cutouts or recesses for receiving various components housed in case 12. In some embodiments, as shown in FIGS. 6 and 7, base foam cushion 65 can have a first base foam cushion layer 66 and a second base foam cushion layer 68. First base foam cushion layer 66 can be positioned between second base foam cushion layer 68 and base 42, and particularly a bottom of base 42. In some embodiments, first base foam cushion layer 66 can rest against the bottom of base 42 and second base foam cushion layer 68 can rest against first base foam cushion layer 66 and can include one or more cutouts or recesses for receiving the components positioned in base 42. In some embodiments, first base foam cushion layer 66 and second base foam cushion layer 68 can have varying foam densities, with the foam density of second base foam cushion layer 68 being greater than the foam density of first base foam cushion layer 66. For instance, first base foam cushion layer 66 in some embodiments can have a foam density between about 1 and 3 pounds per cubic foot and second base foam cushion layer 68 can have a foam density between about 3 and 5 pounds per cubic foot. In one embodiment, first base foam cushion layer 66 can have a foam density of about 2 pounds per cubic foot, and second base foam cushion layer 68 can have a foam density of about 4 pounds per cubic foot. Cushioning foam layers with varying densities can provide varying impact dissipation characteristics on the internal components of case 12 when case 12 is dropped from a high distance or case 12 is otherwise subjected to a large external force, to help protect the internal components housed in case 12 from damage due to the external force.

As shown in FIGS. 1 and 6, in some embodiments, the lid 44 contains a lid foam cushion 69, albeit less thick due to the difference in depth of the cavities 15a and 15b between the base 42 and lid 44, respectively, shown in FIG. 6. Lid foam cushion layer 69 can help provide added support, protection, and gravitational force deceleration for components, including antenna array 31 in some embodiments, positioned in lid 44, in the event case 12 is dropped from a high distance or exposed to external forces. Lid foam cushion 69 of lid 44 can also contain cutouts or recesses for the exposure of components positioned in lid 44 of case 12 when lid 44 is in the open position. In some embodiments, as shown in FIGS. 6-7, lid foam cushion 69 positioned in lid 44 can include a first lid foam cushion layer 70 and a second lid foam cushion layer 72. First lid foam cushion layer 70 can be positioned between second lid foam cushion layer 72 and lid 44, and particularly the top of lid 44. First lid foam cushion layer 70 can be positioned against lid 44, and second lid foam cushion layer 72 can be positioned against first lid foam cushion layer 70, the second lid foam cushion layer 72 including multiple cutouts or recesses for receiving components positioned within lid 44. In some embodiments, first and second lid foam cushion layers 70 and 72 can have varying foam densities, with second lid foam cushion layer 72 having a foam density that is greater than the foam density of first lid foam cushion layer 70. For instance, first lid foam cushion layer 70 in some embodiments can have a foam density between about 1 and 3 pounds per cubic foot and second lid foam cushion layer 72 can have a foam density between about 3 and 5 pounds per cubic foot.

In some embodiments, base 42 can include a rigid insert which can house one or more components of the apparatus 10, including but not limited to the power supply 24, the router device 14, or the antenna array 31. In some embodiments, the rigid insert can include a plurality of recesses for receiving various components of the apparatus 10. The rigid insert can be made from a metal, plastic, or other suitable rigid material and can provide structural support and protection for the components of the apparatus 10 positioned within case 12.

Wireless power supply 24 may be used to power any component in case 12. In certain embodiments, wireless power supply 24 may be charged via AC/DC adapter 16. Wireless power supply 24 in other embodiments can also be configured to receive a charge via a solar panel charger, a cigarette lighter adapter, or various other chargers and/or adapters known in the art. Power supply 24 may have additional output ports for charging laptops, notebooks, notepads, cellular phones, etc. In certain embodiments, various adapters that allow for power to be supplied to other external components may also be housed within case 12 and connected to power supply 24.

Figure 14:
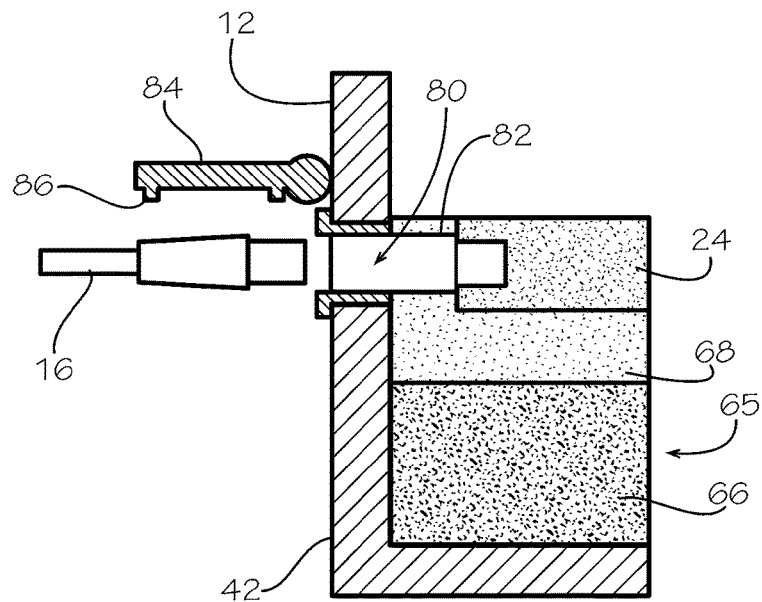
FIG. 14 is a partial cross-section view of another embodiment of a data communications apparatus of the present disclosure where a base of the case has a charging port sized to receive the plug of an adapter to recharge the power source.
Figure 15:
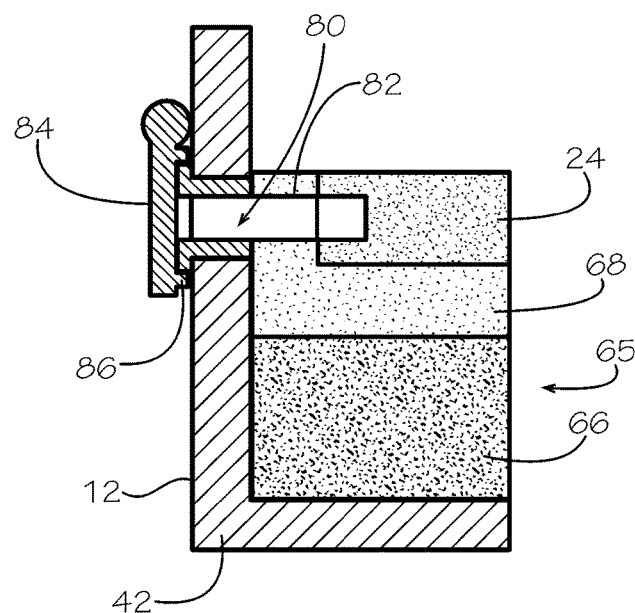
FIG. 15 is a partial cross-section view of the apparatus of FIG. 14 with a cap for the charging port in a closed position over the charging port.

In some embodiments, as shown in FIGS. 14 and 15, base 42 can include a charging port 80 defined in a side of base 42. Charging port 80 can be positioned such that a plug of AC/DC adapter can be received through charging port 80 and connected to power supply 24 positioned within case 12. By having a charging port 80 defined in base 42 which can provide access to power supply 24, case 12 can be placed in a closed position as power supply 24 and apparatus 10 are being recharged, which can help save space. In some embodiments, charging port 80 can include a smooth inner grommet which can provide a smooth internal contact surface as the plug of AC/DC adapter 16 is inserted through charging port 80, which can help prevent damage to AC/DC adapter 16.

In some embodiments, a plug access channel 82 can be defined in base foam cushion layer 65 and particularly second base foam cushion layer 68, plug access channel 82 providing access to power supply 24 from charging port 80 and through second base foam cushion layer 68. In some embodiments, apparatus 10 can include a charging port cap 84 which can be pivotally attached to an exterior of base 42. Charging port cap 84 can be rotated to an open position to provide access to charging port 80 and power supply 24. Once charging of power supply 24 is complete, charging port cap 84 can be rotated to a closed position over charging port 80 to block access to charging port 80. In some embodiments, charging port cap 84 can include an outer gasket or seal 86 which can be disposed against base 42 around charging port 80 when charging port cap 84 is in the closed position over charging port 80, gasket 86 forming a seal around charging port to help prevent liquids or other contaminates from entering case 12 via charging port 80. In some embodiments, apparatus 10 can include a releasable fastener, such as snap fit member, a hook and loop fastener, buttons, snaps, hooks, clasps, etc., which can selectively retain charging port cap 84 in the closed position over charging port 80.

Figure 10:
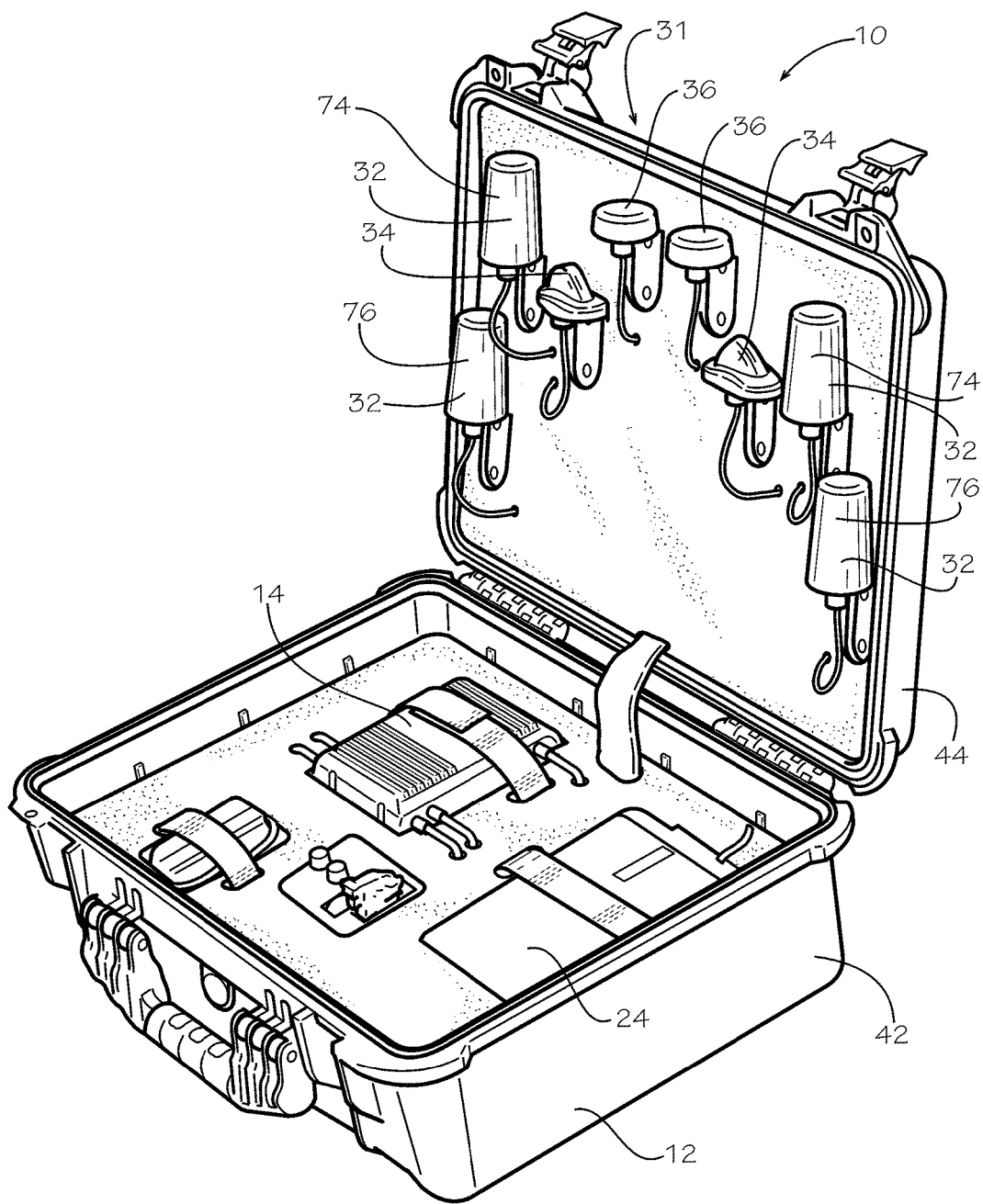
FIG. 10 is a perspective view of another embodiment of a data communications apparatus of the present disclosure having an antenna array with multiple pairs of cellular antennas.
Figure 11:
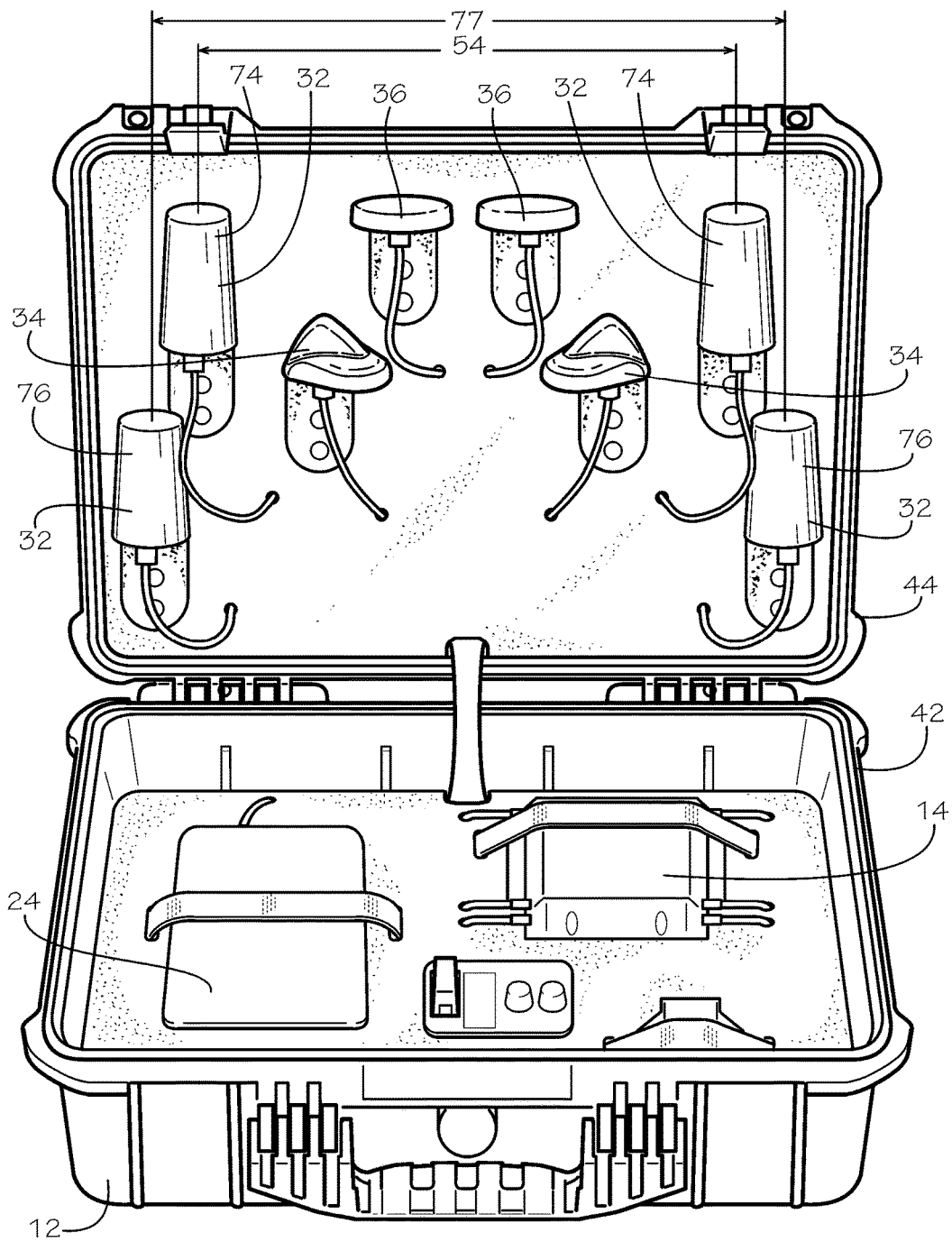
FIG. 11 is a front perspective view of the apparatus of FIG. 11.

Another embodiment of a data communications case 12, shown in FIGS. 10-11, includes an antenna array 31 having a first pair 74 of cellular antennas 32, and a second pair 76 of cellular antennas 32. In some embodiments, first pair 74 of cellular antennas 32 can be positioned at least 12 inches apart from one another within case 12, and second pair 76 of cellular antennas 32 can be positioned at least 12 inches apart from one another within case 12, which can help reduce frequency interference between cellular antennas 32. In other words, cellular antenna separation distance 54 between first pair 74 of cellular antennas 32 can be greater than or equal to about 12 inches, and second cellular antenna separation distance 77 can be greater than or equal to about 12 inches. Each pair 74 and 76 of cellular antennas 32 can be capable of sending and receiving a signal across a cellular network, such that apparatus 10 of FIGS. 10-11 when used can accommodate cellular service with two different cellular carriers.

In one embodiment shown in FIG. 12, antenna array 31 is contained in an antenna array housing 64 retained or secured to base 42 using one or more fastening straps 26. Antenna array 31 and antenna array housing 64 can also be described as being a singular antenna with multiple antenna elements.

In one embodiment, the antenna housing 64 can contain five isolated high performance antenna elements, including two cellular antenna elements utilizing distinct wireless frequencies and supporting MiMo; two dual band wireless antenna elements supporting MiMo and diversity operation for WIFI and WiMax wireless networks; and one GPS antenna element. In some embodiments, the antenna elements in antenna array housing 64 can be ground plane independent such that antenna array 31 can be positioned either in lid 44 or in base 42 of case 12, and the antenna elements can maintain a generally high performance even when mounted on a non-metallic surface.

Having antenna array 31 compactly arranged within a durable case 12, and particularly within a compact antenna housing 64, as shown in FIG. 12, can help reduce the space necessary to accommodate antenna array 31 within case 12. As such, the overall size, weight, and profile of case 12 can be reduced if desired. In some embodiments, the overall size of case 12 in FIG. 12 can be about 15 inches in length by 11 inches in width. Having a smaller overall size of case 12 can further help make case 12 more convenient to transport. For instance, for a smaller office setting where less communication capabilities are needed, case 12 of FIG. 12 can easily be transported between various locations on site as desired. Additionally, hospitals having nurses moving from room to room and documenting patient status can carry a smaller case 12 with them such that they have wireless access with them at all times and can update patient records on a hospital network or system in real time as they move from patient to patient. Similarly, traveling sales forces can conveniently carry a smaller case 12 with them to remote business meetings to ensure they have wireless and cellular service. Other uses and applications of the relatively smaller case of FIG. 12 will be readily apparent to one of skill in the art.

Figure 13:
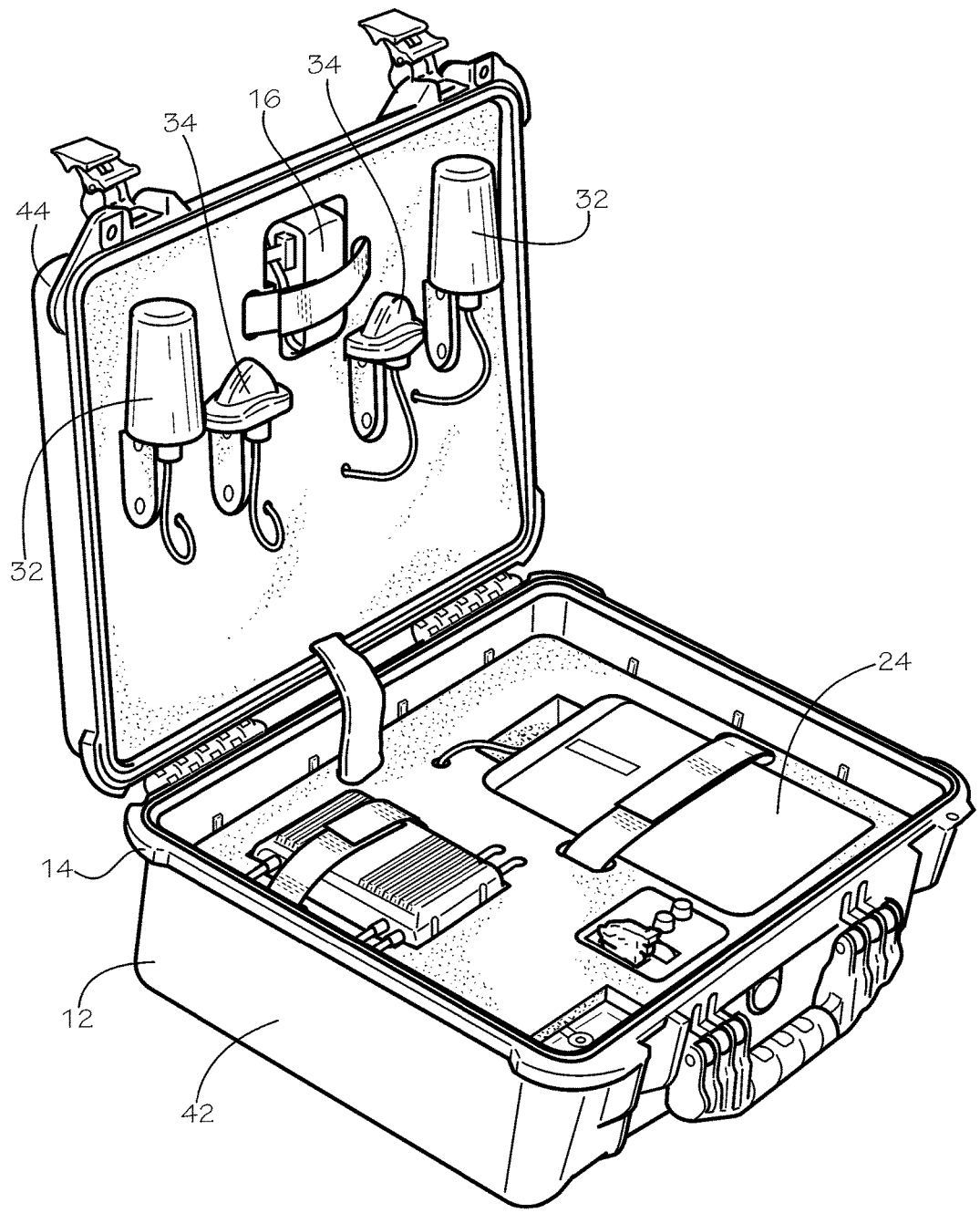
FIG. 13 is a perspective view of another embodiment of a data communications apparatus of the present disclosure.

In another embodiment, shown in FIG. 13, a GPS antenna can be removed from antenna array 31, and AC/DC adapter 16 can be positioned and retained on lid 44 such that the overall dimensions of case 12 can be reduced. AC/DC adapter 16 can generally be located in position corresponding to the location of the GPS antenna on lid 44 shown in FIG. 1.

Figure 16:
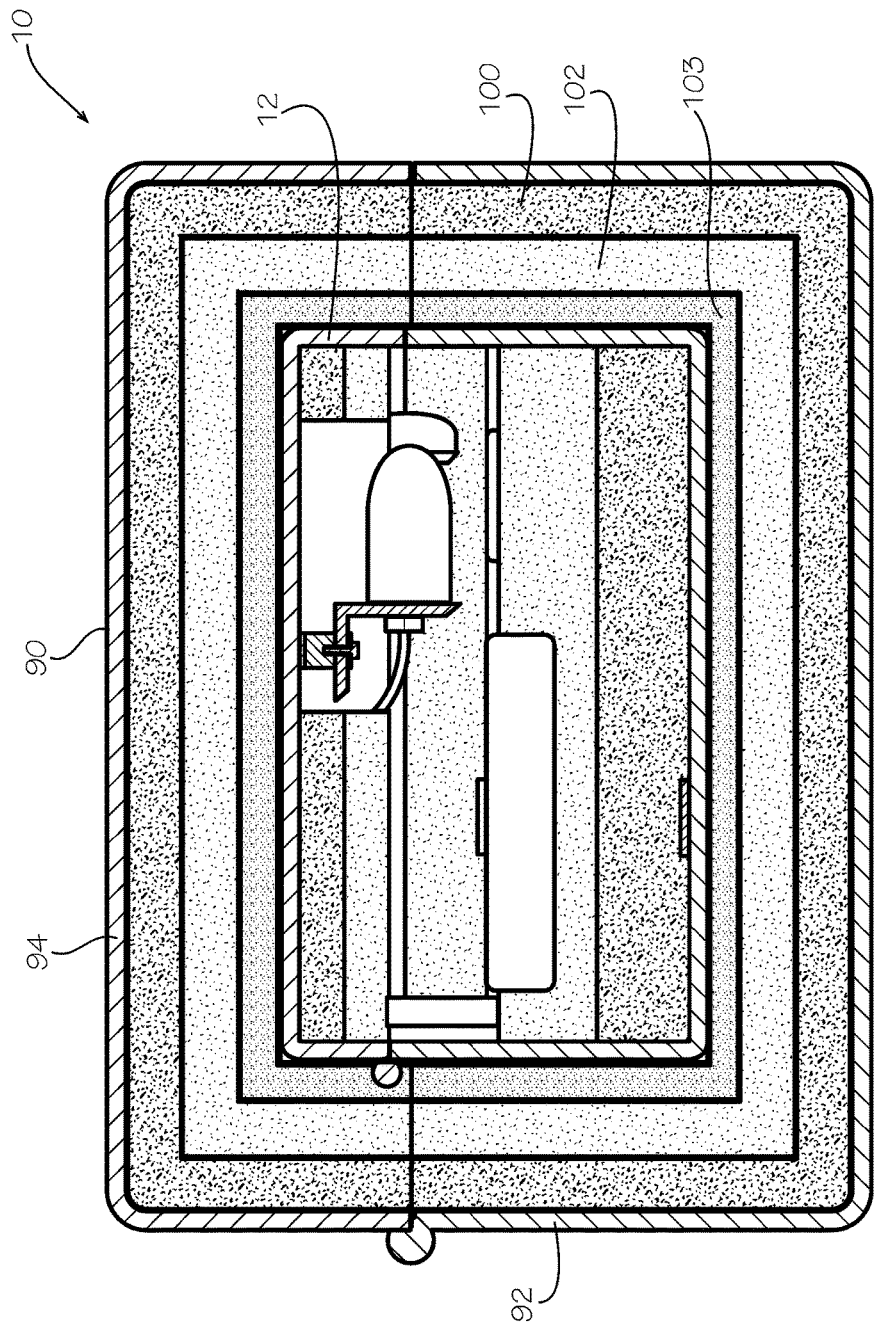
FIG. 16 is a cross-section view of another embodiment of a data communications apparatus of the present disclosure including a second outer protective case having multiple second case cushion foam layers.
Figure 17:
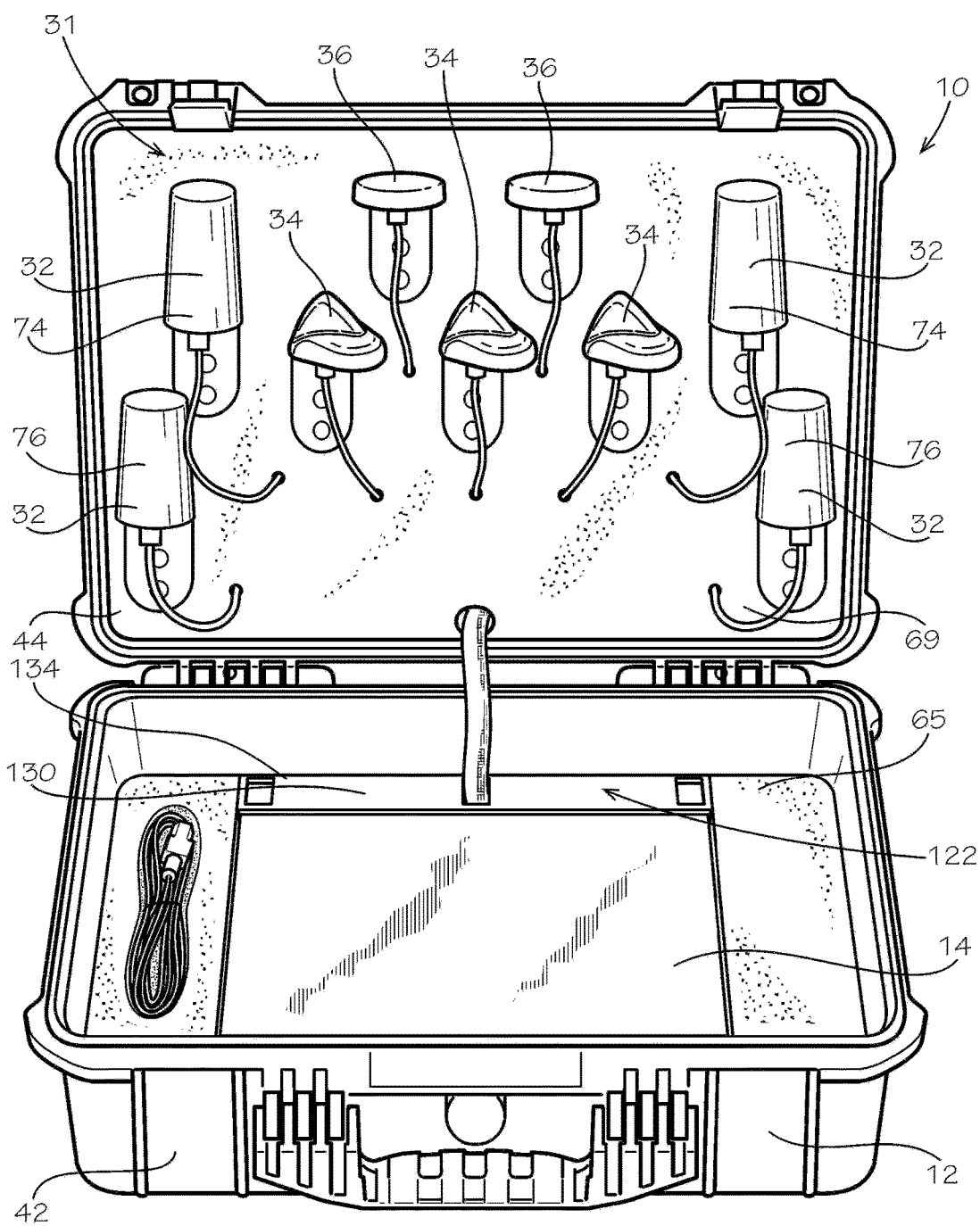
FIG. 17 is a perspective view of another embodiment of a data communications apparatus of the present disclosure including an access port defined in the case.

Another embodiment of a data communications apparatus 10 is shown in FIG. 16. In some embodiments, a second outer case 90 including a second base 92 and second lid 94 can be selectively enclosed around case 12. Second case 90 can provide an additional layer of protection for the communications components positioned within case 12. In some embodiments, one or more second case foam cushion layers can be positioned in second case 12 and can surround case 12 when second case 90 is in a closed position, as shown in FIG. 16. In some embodiments, second case 90 can include a first second case foam cushion layer 100, a second second case foam cushion layer 102, and a third second case foam cushion layer 104. In some embodiments, second case 90 can also include a pressure release valve configured to release pressure inside second case 90 if the pressure rises above a predetermined threshold.

In some embodiments, first second case foam cushion layer 100 can have a foam density that is greater than the foam density of second second case foam cushion layer 102, and second second case foam cushion layer 102 can have a foam density that is greater than the foam density of third second case foam cushion layer 104. In some embodiments, the foam density of first second case foam cushion layer 100 can be between about 3 and 5 pounds per cubic foot, the foam density of second second case foam cushion layer 102 can be between about 2 and 3 pounds per cubic foot, and the foam density of third second case foam cushion layer 102 can be between about 1 and 2 pounds per cubic foot. In some embodiments, the foam density of first second case foam cushion layer 100 can be about 4 pounds per cubic foot, the foam density of second second case foam cushion layer 102 can be about 2.8 pounds per cubic foot, and the foam density of third second case foam cushion layer 102 can be about 1.8 pounds per cubic foot. Second case foam cushion layers 100, 102, and 104 can be made from either open cell or closed cell foam materials. In some embodiments, first second case foam cushion layer 100 can be made from closed cell foam, and second and third second case foam cushion layers 102 and 104 can be made from open cell foam. While the embodiment shown in FIG. 16 shows three second case foam cushion layers, in other embodiments, varying numbers of foam cushion layers can be implemented in second case 90.

Having a second protective case 90 with foam cushion layers can provide additional protection to the communications components of case 12, which can be beneficial in emergency, military, or other situations where it may be advantageous to drop apparatus 10 from a high altitude, for instance when it is desirable to drop apparatus 10 from a helicopter. Having additional protection and foam cushion layers around the communications components of apparatus 10 can help absorb the impact as apparatus 10 is dropped from a higher altitude.

In another embodiment of the case 12 shown in FIGS. 17-20, the antenna array 31 can include three wireless antennas 34, and the router device 14 can support 8 different wireless networks and SSIDs such that the case 12 can support up to 256 simultaneous wireless users. The router device 14 can also include a plurality of external ports 120, for instance LAN/WAN Ethernet ports and Power over Ethernet (PoE) ports in some embodiments, for multiple users to connect electronic devices directly to the router device 14. The embodiment of FIGS. 17-20 also may include two pairs of cellular antennas 74 and 76, similar to the embodiment of FIG. 10 previously discussed, such that the case 12 can communicate with two cellular carriers simultaneously, or have a back-up cellular communication capability in the event a primary cellular carrier signal is unavailable.

Referring again to FIGS. 17-20, in some embodiments, the external ports 120 of the router device 14 can be located on a single side 126 of the router device 14. In some embodiments, as shown in FIG. 19, the case 12 can include an access port 122 and an access port door 124 pivotally connected to the case 12 and movable between an open and a closed position to selectively cover the access port 122 when the access port door 124 is in the closed position. In some embodiments where the router device 14 is located in the base 42, the access port 122 can be defined on the base 42. In other embodiments where the router device 14 is located in the lid 44, the access port 122 can be defined on the lid 44.

The router device 14 can in some embodiments be positioned in the case 12 such that the side 126 of the router device 14 including the external ports 120 can be aligned with the access port 122 such that the external ports 120 can be oriented towards and accessible through the access port 122 from an exterior of the case 12. In some embodiments, the router device 14 can be positioned in the base 42 such that the external ports 120 can be located on a rear side 126 of the router device 14. The base 42 can have a back side 138 and the access port 122 can be defined in the back side 138 of the base 42. As such, the rear side 126 of the router device 14 can be aligned with and oriented towards the access port 122 defined in the back side 138 of the base 42 such that electronic devices can be connected to the router device 14 through a back side 138 of the base 42 and a rear of the case 12. In other embodiments, the access port 122 can be defined in various other sides of the base 42 or lid 44 of the case 12 with the router device 14 oriented to have external ports 120 align with the access port 122 when the router device 14 is positioned in the case 12.

The access port door 124 can be opened when a user desires to connect directly to the router device 14 via external ports 120 on router device 14. The access port 122 and router access port door 124 can provide access to the external ports 120 on the router device 14 when the router device 14 is positioned in the case 12. A user can then insert Ethernet or other suitable cables through the access port 122 to connect external devices to the router device 14. In some embodiments, router access port door 124 can include a gasket 128 or other sealing material which can form a seal around the access port 122 when the access port door 124 is in the closed position. In such embodiments, when the door 124 moves to the closed position, the access port 122 can be covered and sealed such that the case 12 can maintain its dustproof, waterproof, and contaminant proof characteristics when the lid 40 and the access port door 124 are both in the closed position.

Figure 21:
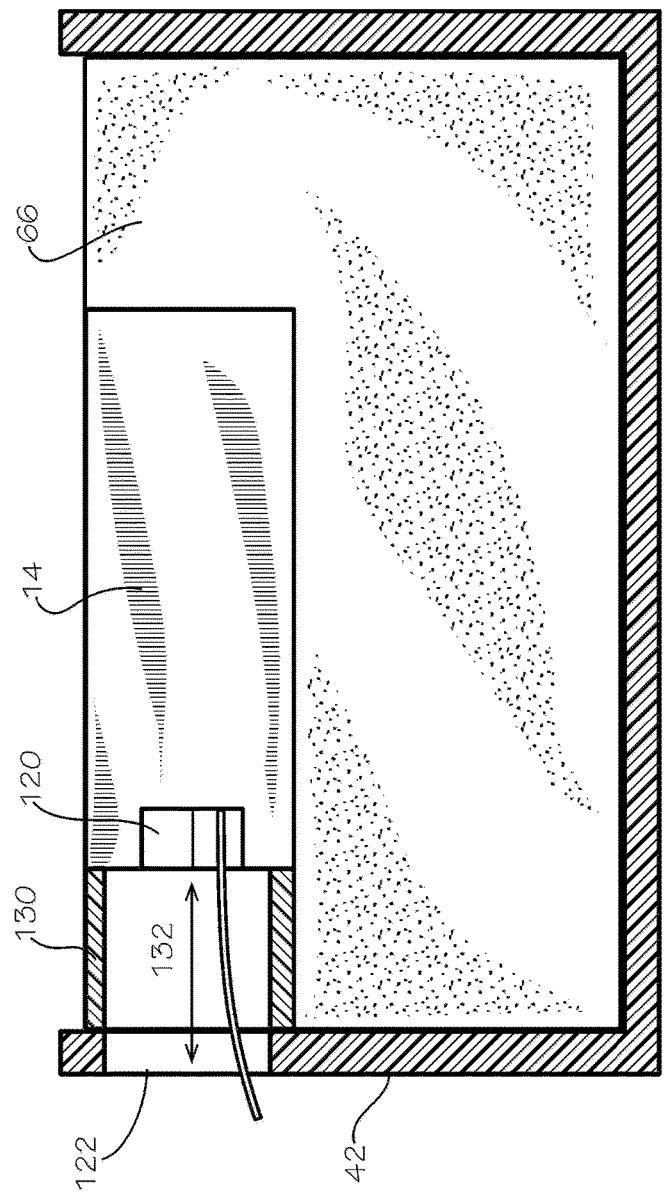
FIG. 21 is a cross-sectional view of the wire receiving conduit of the data communications apparatus.

In some embodiments, the case 12 can include a wire receiver conduit 130 positioned between external ports 120 of the router device 14 and the access port 122 when the router device 14 is positioned in the case 12. The wire receiving conduit 130 can be made from metal or plastic in some embodiments and can generally form the shape of a box or rectangular shell that can allow or facilitate passage of one or more wires from the access port 122, through the wire receiving conduit 130, and to the router device 14. The wire receiving conduit 130 can be comprised solely of a hard or rigid material, solely of a resilient material, or may contain both a rigid material and resilient material. The wire receiving conduit 130 could comprise any of the foam materials described herein, such that the wire receiving conduit 130 may also act to protect the router device from stresses during transport. The wire receiving conduit 130 may also act to retain the router device 14 in a position spaced apart from the base. The wire receiving conduit 130 can include a central passage 132 extending through the wire receiving conduit 130 in a direction from the access port 122 to the router device 14, such that the central passage 132 is oriented to allow passage of electrical wires from the access port 122 to the router device 14, as shown in FIG. 21. The wire receiving conduit 130 can be hollow and have open front and back ends, the front and back ends defining the central passage 132. As such, the external ports 120 of the router device 14 can be accessible through the access port 122 and the wire receiving conduit 130. The central passage 132 can allow electrical wires such as Ethernet cables from external devices to extend through the access port 122 and the wire receiving conduit 130 and connect to the router device 14.

Referring again to FIGS. 17-20, the wire receiving conduit 130 can also include one or more wire holes 134 defined through a top surface 136 of the wire receiving conduit 130, the wire holes 134 open to the central passage 132. The wire holes 134 can allow wires from the antennas, power supply, power switch, power adapters, or any other components contained in the case 12 to pass into the wire receiving conduit 130 from within the case 12 and connect to the router device 14 at an appropriate location. The wire receiving conduit 130 can help facilitate connection of one or more components of the case 12 or external devices to the external ports 120 of the router device 14, and can help protect and provide support to the wires at a point of connection with the router device 14.

Figure 18:
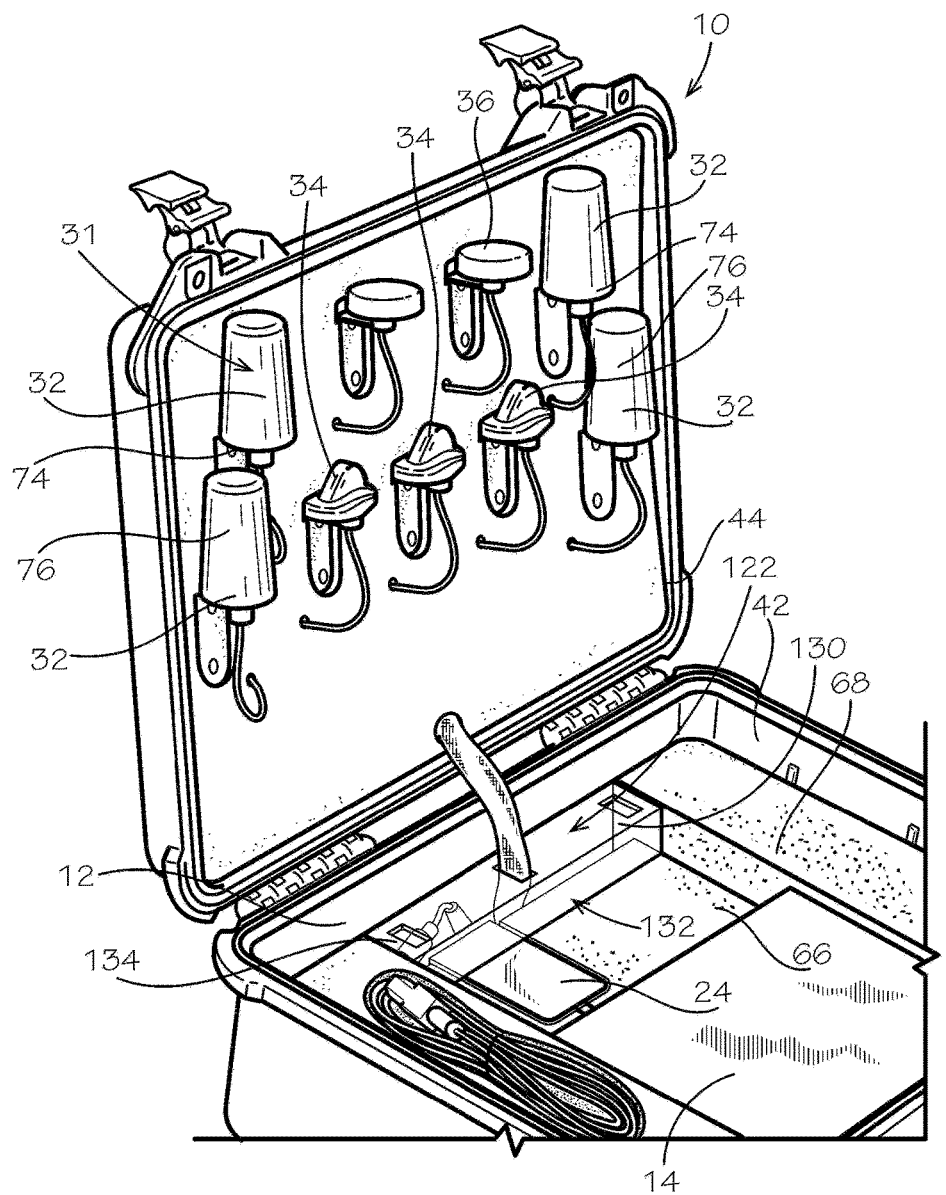
FIG. 18 is a detailed perspective view of the apparatus of FIG. 17 with the router device partially removed from the case.
Figure 19:
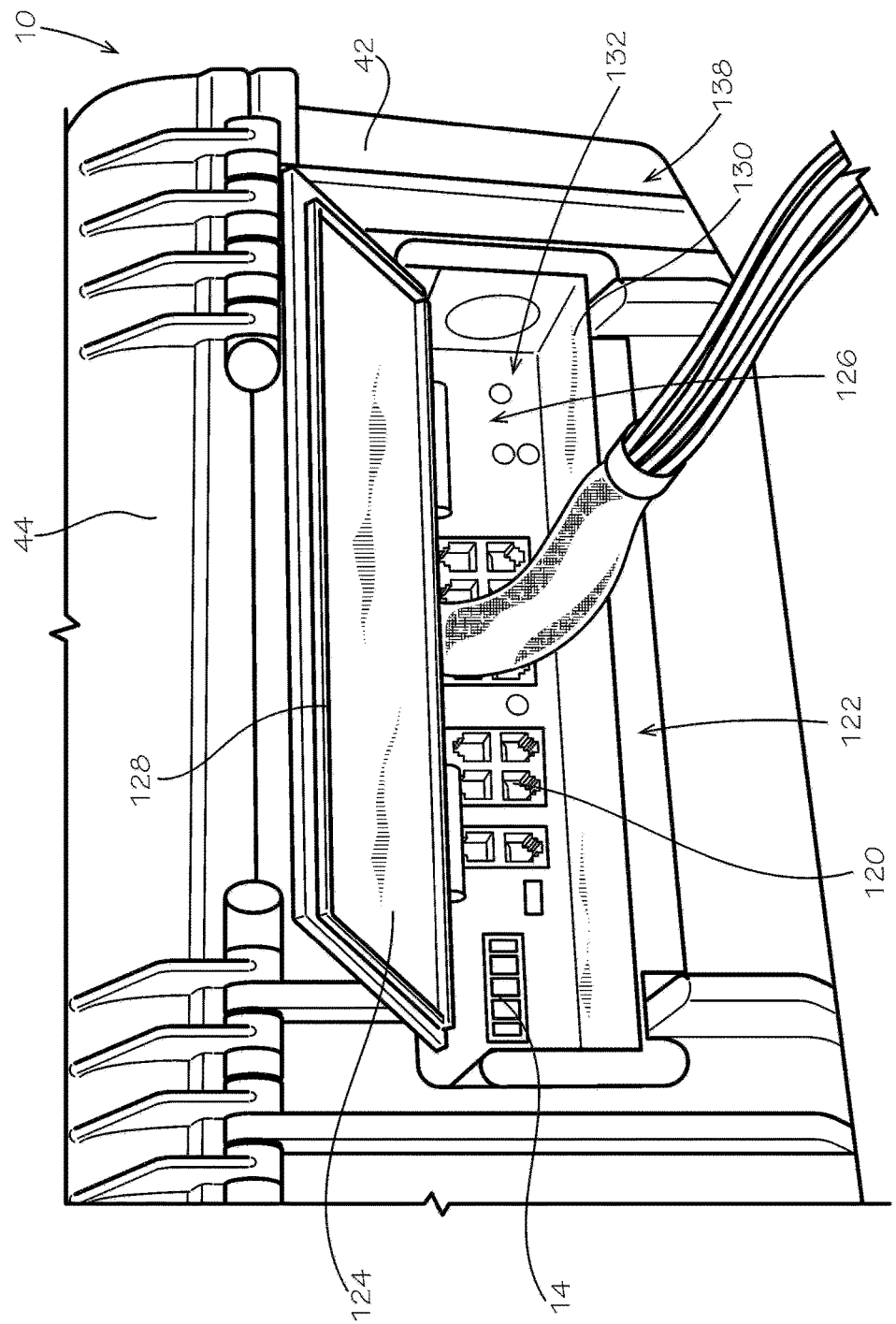
FIG. 19 is a back perspective view of the apparatus of FIG. 17 showing the external ports of the router device being accessible through the access port.
Figure 20:
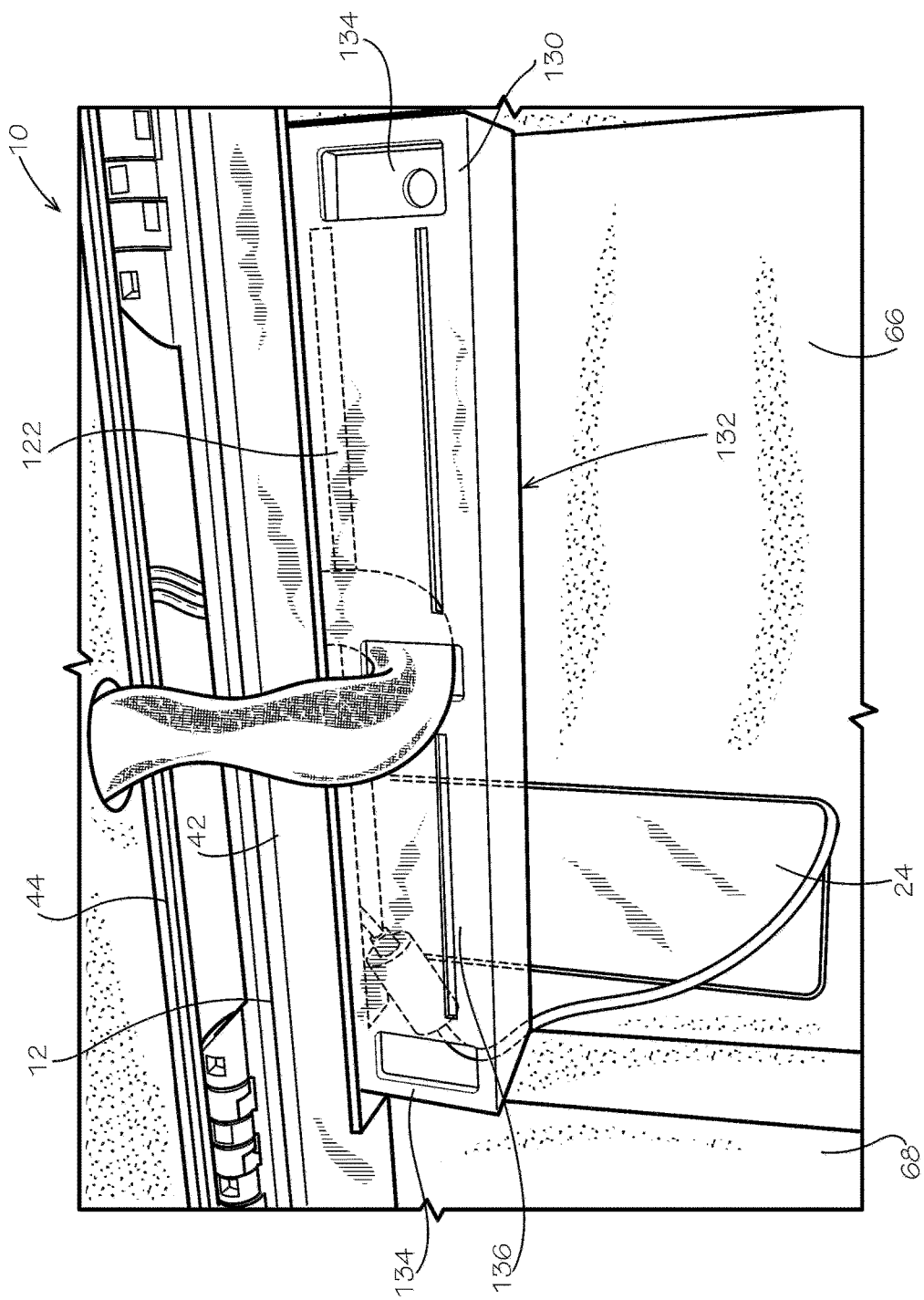
FIG. 20 is a detailed perspective view of the apparatus of FIG. 17 showing a wire receiving conduit positioned adjacent the access port.

The wire receiving conduit 130 can be adhered or otherwise secured to one or all of the first base cushion layer 66, the second base cushion layer 68, or the base 42, in order to maintain the conduit 130 in a desired position, for instance in the position shown in FIG. 18 adjacent the access port 122 defined in a back side of the base 42. In some embodiments, the wire receiving conduit 130 can be sealingly adhered to one or all of the first base foam cushion layer 66, the second base foam cushion layer 68, or the base 42, such that seals can be formed around the circumference of the wire receiving conduit 130 to reduce the number of leaks spots for liquids, dust and other contaminants to enter the case 12.

In the embodiment of FIGS. 17-20, the power supply 24 can be positioned within a recess in the first base foam cushion layer 66 and the router device 14 can be positioned in a cutout defined in the second base foam cushion layer 68 such that the power supply 24 is positioned below the router device 14 in order to conserve space and help reduce the overall size and dimensions of the case 12. The cutout in the second base foam cushion layer 68 for the router device 14 can be positioned adjacent the access port 122 such that when the router device 14 is positioned in the cutout, the external ports 120 of the router device 14 can be oriented towards and accessible through the access port without interference from the second base foam cushion layer 68.

Figure 22:
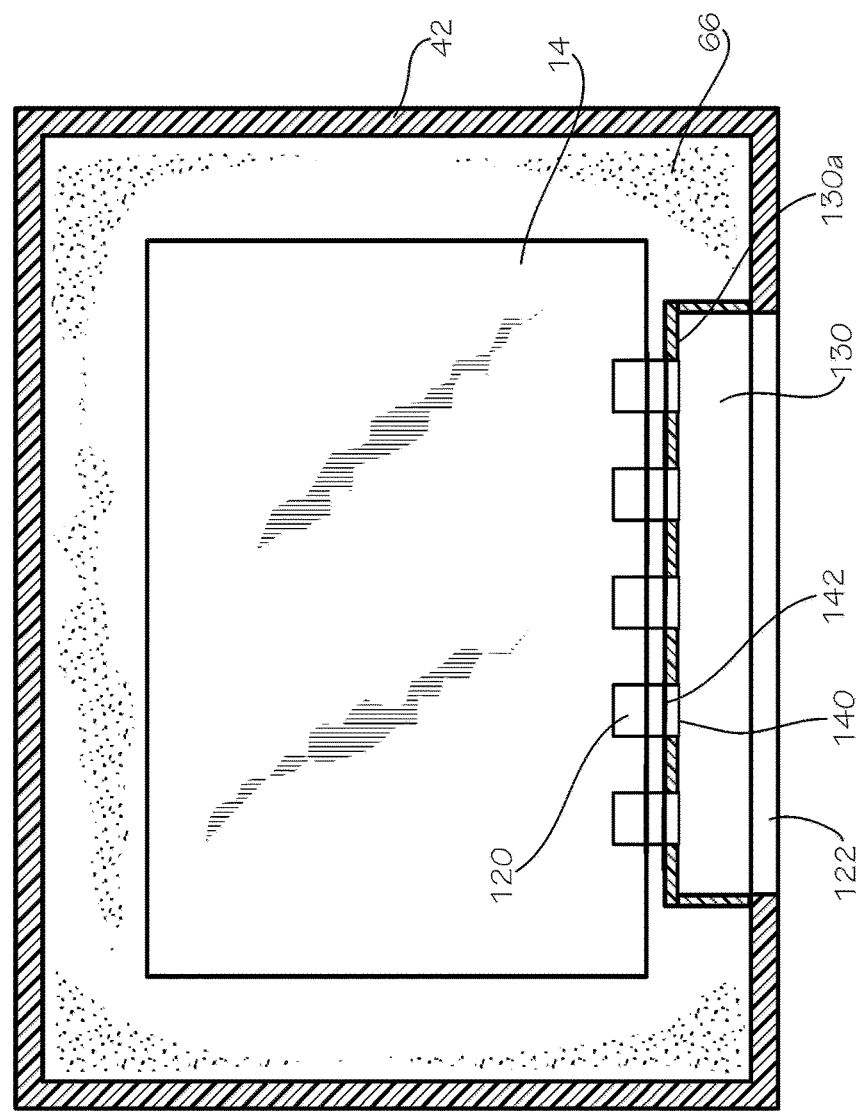
FIG. 22 is a cross-sectional view of another embodiment of a data communications apparatus having a base foam cushion extending between a wire receiving conduit and a router device.

Referring now to FIG. 22, in some embodiments the external ports 120 can be positioned across only a portion of a side of the router device 14 that faces the access port 122. In such embodiments, the cutout in the base foam cushion layer 66 can be sized such that the base foam cushion layer 66 covers a portion of the side of the router device 14 facing the access port 122, while still providing adequate access to the external ports 120 through the access port 122. The width of the access port 122 and can thus be smaller than the width of the router device 14 in some embodiments with the access port 122 still being wide enough to provide access to all of the external ports 120 of the router device 14.

In some embodiments, the base foam cushion layer 66 can extend between the wire receiving conduit 130 and the router device 14 such that the base foam cushion layer 66 can provide a layer of padding between the wire receiving conduit 130 and the router device 14. In some embodiments, the front end 130a of the wire receiving conduit 130 can be partially obstructed, with conduit openings 140 defined in the front end 130a of the wire receiving conduit 130. The conduit openings 140 can be aligned with corresponding external ports 120 on the router device 120. In some embodiments, the base foam cushion layer 66 can extend between the wire receiving conduit 130 and the router device 14 and the base foam cushion layer 66 can include base foam cushion openings 142 which align with corresponding conduit openings 140 and corresponding external ports 120 on the router device 14. As such, an electrical wire can be passed through the wire receiving conduit 130, through a conduit opening 140, through a corresponding base foam cushion opening 142, and can be connected to a corresponding external port 120 on the router device 14.

Figure 23:
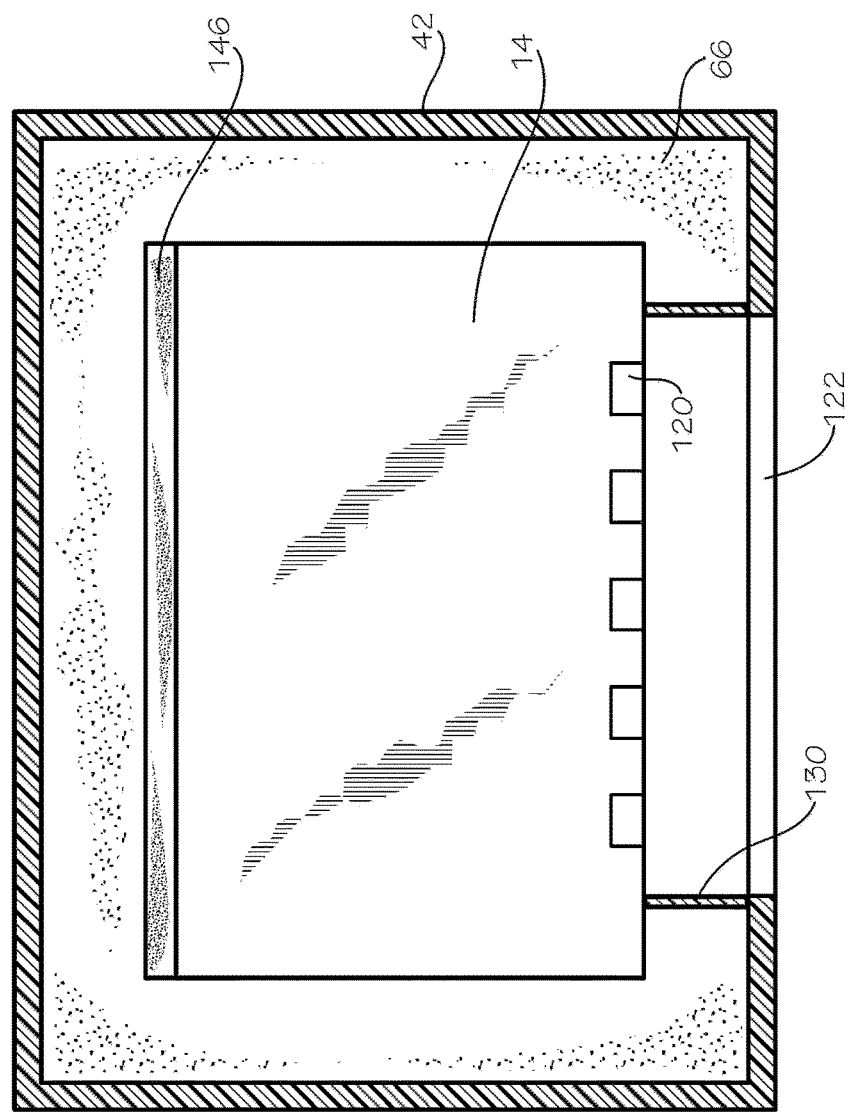
FIG. 23 is a cross-sectional view of another embodiment of a data communications apparatus having a spacer foam pad positioned between a wire receiving conduit and a router device.
Figure 24:
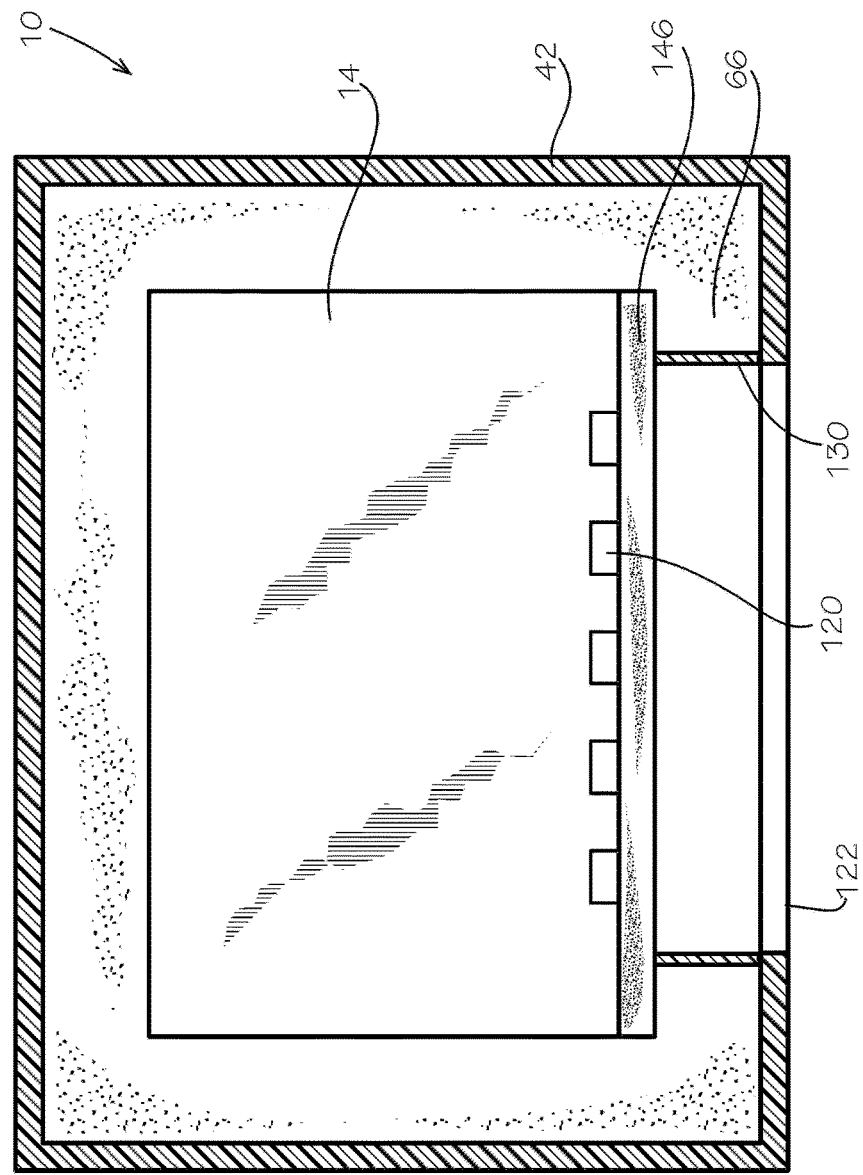
FIG. 24 is a cross-sectional view of the embodiment of FIG. 23 with the spacer foam pad positioned on an opposite side of the router device.

In other embodiments, as shown in FIGS. 23-24, the cutout for the router device 14 can be larger than the router device 14, such that the router device 14 can be moved within the cutout in the base foam cushion layer 66. A spacer foam pad 146 can be moved to different locations within the cutout to force the router device 14 to abut either the base foam cushion layer 66 or the wire receiving conduit. For instance, in FIG. 23, the spacer foam pad 146 can be positioned forward of the router device 14 to force the router device 14 to abut the wire receiving conduit 130, and to allow access to the external ports 120 through the access port 122 and the wire receiving conduit 130. The spacer foam pad 146 can alternatively be positioned between the router device 14 and the wire receiving conduit 130, as shown in FIG. 24, to provide a layer of padding between the router device 14 and the wire receiving conduit 130 and to abut the front of the router device 14 against the base foam cushion layer 66. The configuration shown in FIG. 23 can be utilized during use of the apparatus 10 when wires are to be connected to the router device 14 and access to the external ports 120 on the router device 14 is required. The orientation shown in FIG. 24 can be utilized during transport of the apparatus 10 help prevent damage to the router device 14 by the wire receiving conduit 130 during transport where the router device 14 can potentially move within the cutout in the base foam cushion layer 66.

While FIGS. 1-24 show various components, including power supply 24, router device 14, antenna array 30, cellular antennas 32, wireless antennas 34, GPS antennas 36, power switch 22, adapter 16, etc., in various orientations and positions within case 12, base 42, and lid 44, each of the various components within case 12 can be positioned in either base 42 or lid 44 of case 12. In some embodiments, a portion of the antennas in antenna array 30 can be positioned within base 42, and a portion of the antennas in antenna array 44 can be positioned in lid 44. Among other reasons, it may be advantageous to position the antennas of the antenna array in various positions within the case when using different size cases, due to varying numbers of different types of antennas used, or to shorten cable length between the antennas and the router device, It is contemplated that the size, shape, and configuration of the data communications case and its various components discussed herein may widely vary. Thus, although there have been described particular embodiments of the present invention of a new and useful DATA COMMUNICATIONS CASE HAVING AN INTERNAL ANTENNA ARRAY, it is not intended that such references be construed as limitations upon the scope of this invention.

What is claimed is:

1. A data communications apparatus comprising:
 a case having a base and a lid connectable to the base, the lid movable with respect to the base between an open position and a closed position;
 a power supply positioned inside the case;
 a router device positioned inside the case, the router device including a plurality of external ports;
 an antenna array secured to the case, the antenna array in electrical communication with the router device;
 an access port defined in the case and aligned with the external ports of the router device such that the external ports are accessible through the access port;
 an access port door pivotally connected to the case, the access port door movable between an open position and a closed position on the case, the access port door covering the access port when the access port door is in the closed position; and
 a wire receiving conduit positioned between the external ports of the router device and the access port, the wire receiving conduit including a central passage extending through the wire receiving conduit in a direction from the access port to the external ports in the router device.

2. The apparatus of claim 1, further comprising a gasket on the access port door, the gasket forming a seal around the access port when the access port door is in the closed position.

3. The apparatus of claim 1, wherein the antenna array further comprises at least two cellular antennas and at least two wireless networking antennas.

4. The apparatus of claim 3, wherein the antenna array further comprises a global positioning antenna.

5. The apparatus of claim 1, wherein the wire receiving conduit further includes a top surface and one or more wire holes defined through the top surface, the wire holes open to the central passage of the conduit.

6. The apparatus of claim 1, further comprising a spacer foam pad removably positioned between the router device and the wire receiving conduit.

7. The apparatus of claim 1, further comprising:
 a base foam cushion positioned in the base; and
 a lid foam cushion positioned in the lid;
 wherein each of the base foam cushion and the lid foam cushion comprise open cell foam having a foam density greater than or equal to about 2 pounds per cubic foot.

8. The apparatus of claim 7, wherein:
 the access port is defined in the base;
 the base foam cushion further comprises a cutout positioned adjacent the access port; and
 the router device is positioned within the cutout with the external ports of the router device oriented toward the access port.

9. The apparatus of claim 1, wherein:
 the base includes a back side; and
 the access port is defined in the back side of the base.

10. The apparatus of claim 1, wherein the power supply is positioned beneath the router device within the base.

11. The apparatus of claim 1, wherein the external ports of the router device are external Ethernet ports.

12. A data communications apparatus comprising:
 a case having a base and a lid connectable to the base, the lid movable with respect to the base between an open position and a closed position;
 a power supply positioned inside the base;
 a router device positioned inside the base, the router device selectively receiving power from the power supply, the router device including a plurality of external ports;
 an antenna array secured to the case, the antenna array in electrical communication with the router device, the antenna array including at least two cellular antennas and at least two wireless networking antennas;
 an access port defined in the base, the external ports accessible from an exterior of the case through the access port; and
 a wire receiving conduit positioned between the external ports of the router device and the access port, the wire receiving conduit including a central passage extending through the wire receiving conduit in a direction from the access port to the external ports in the router device, a top surface, and one or more wire holes defined through the top surface, the wire holes open to the central passage of the conduit.

13. The apparatus of claim 12, further comprising:
 a base foam cushion positioned in the base and at least partially surrounding the power supply and the router device; and
 a lid foam cushion positioned in the lid and at least partially surrounding the antenna array.

14. The apparatus of claim 13, wherein:
the base foam cushion includes a first base foam cushion layer and a second base foam cushion layer, the first base foam cushion layer positioned between the base and the second base foam cushion layer.

15. The apparatus of claim 14, wherein:
the second base foam cushion layer includes a cutout adjacent the access port; and
the router device is positioned within the cutout in the second base foam cushion layer with the external Ethernet ports oriented toward the access port.

* * * * *